United States Patent
Folts et al.

(10) Patent No.: US 8,886,267 B2
(45) Date of Patent: Nov. 11, 2014

(54) FAULT CURRENT LIMITING HTS CABLE AND METHOD OF CONFIGURING SAME

(75) Inventors: Douglas C. Folts, Baraboo, WI (US); James Maguire, Andover, MA (US); Jie Yuan, South Grafton, MA (US); Alexis P. Malozemoff, Lexington, MA (US)

(73) Assignee: American Superconductor Corporation, Devens, MA (US)

( * ) Notice: Subject to any disclaimer, the term of this patent is extended or adjusted under 35 U.S.C. 154(b) by 657 days.

(21) Appl. No.: 12/951,293

(22) Filed: Nov. 22, 2010

(65) Prior Publication Data

US 2011/0132631 A1 Jun. 9, 2011

Related U.S. Application Data

(63) Continuation of application No. 11/688,809, filed on Mar. 20, 2007, now Pat. No. 7,902,461, which is a continuation-in-part of application No. 11/673,281, filed on Feb. 9, 2007.

(51) Int. Cl.
*H01B 12/02* (2006.01)
*H01B 12/00* (2006.01)
*H01L 39/24* (2006.01)
*H02H 7/00* (2006.01)

(52) U.S. Cl.
USPC ........... 505/230; 505/704; 505/850; 505/869; 361/19; 174/125.1

(58) Field of Classification Search
USPC ......... 505/150, 211, 230, 231, 237, 238, 704, 505/705, 821, 850, 851; 174/125.1, 15.4, 174/15.5; 29/599; 361/19, 141
See application file for complete search history.

(56) References Cited

U.S. PATENT DOCUMENTS

| 3,343,035 | A | 9/1967 | Garwin |
| 3,612,897 | A | 10/1971 | Kanngiesser |
| 4,370,609 | A | 1/1983 | Wilson et al. |

(Continued)

FOREIGN PATENT DOCUMENTS

| CA | 2529661 A1 | 6/2005 |
| CN | 1813317 | 8/2006 |

(Continued)

OTHER PUBLICATIONS

Office Action dated Mar. 22, 2011 received in Chinese patent application No. CN200880011213.7 (8 pages).

(Continued)

*Primary Examiner* — Stanley Silverman
*Assistant Examiner* — Kallambella Vijayakumar
(74) *Attorney, Agent, or Firm* — Occhiuti & Rohlicek LLP

(57) ABSTRACT

A cryogenically-cooled HTS cable is configured to be included within a utility power grid having a maximum fault current that would occur in the absence of the cryogenically-cooled HTS cable. The cryogenically-cooled HTS cable includes a continuous liquid cryogen coolant path for circulating a liquid cryogen. A continuously flexible arrangement of HTS wires has an impedance characteristic that attenuates the maximum fault current by at least 10%. The continuously flexible arrangement of HTS wires is configured to allow the cryogenically-cooled HTS cable to operate, during the occurrence of a maximum fault condition, with a maximum temperature rise within the HTS wires that is low enough to prevent the formation of gas bubbles within the liquid cryogen.

9 Claims, 9 Drawing Sheets

(56) References Cited

U.S. PATENT DOCUMENTS

| | | | |
|---|---|---|---|
| 4,375,659 | A | 3/1983 | Cunningham et al. |
| 5,210,674 | A * | 5/1993 | Yamaguchi et al. ............ 361/19 |
| 5,432,669 | A | 7/1995 | Nemoto et al. |
| 5,801,124 | A | 9/1998 | Gamble et al. |
| 5,859,386 | A | 1/1999 | Herrmann et al. |
| 5,943,204 | A | 8/1999 | Jones et al. |
| 6,081,987 | A | 7/2000 | Kalsi et al. |
| 6,230,033 | B1 | 5/2001 | Scudiere et al. |
| 6,262,375 | B1 | 7/2001 | Engelhardt et al. |
| 6,275,365 | B1 | 8/2001 | Kalsi et al. |
| 6,444,917 | B1 | 9/2002 | Scudiere et al. |
| 6,453,248 | B1 | 9/2002 | Hart et al. |
| 6,649,280 | B1 | 11/2003 | Scudiere et al. |
| 6,743,984 | B2 | 6/2004 | Nassi et al. |
| 7,048,840 | B1 | 5/2006 | Werfel et al. |
| 7,071,148 | B1 | 7/2006 | Selvamanickam et al. |
| 7,135,988 | B2 | 11/2006 | Kawai et al. |
| 7,304,826 | B2 | 12/2007 | Yuan et al. |
| 7,345,858 | B2 | 3/2008 | Lee et al. |
| 7,521,082 | B2 | 4/2009 | Selvamanickam |
| 7,598,458 | B2 | 10/2009 | Yumura et al. |
| 7,724,482 | B2 | 5/2010 | Folts et al. |
| 7,895,730 | B2 | 3/2011 | Baldwin et al. |
| 7,902,461 | B2 | 3/2011 | Folts et al. |
| 2002/0019315 | A1* | 2/2002 | Nassi et al. ............ 505/150 |
| 2002/0027014 | A1 | 3/2002 | Mukoyama et al. |
| 2002/0098985 | A1 | 7/2002 | Ladie' et al. |
| 2002/0105231 | A1 | 8/2002 | Koeppe et al. |
| 2002/0144838 | A1 | 10/2002 | Fritzemeier et al. |
| 2002/0190419 | A1 | 12/2002 | Albrecht et al. |
| 2003/0059652 | A1 | 3/2003 | Wang et al. |
| 2003/0183410 | A1* | 10/2003 | Sinha et al. ............ 174/68.1 |
| 2004/0058522 | A1 | 3/2004 | Ohmatsu |
| 2004/0194290 | A1 | 10/2004 | Dickinson |
| 2004/0266628 | A1* | 12/2004 | Lee et al. ............ 505/238 |
| 2005/0007227 | A1 | 1/2005 | Lee et al. |
| 2005/0173149 | A1 | 8/2005 | Gouge et al. |
| 2006/0040830 | A1* | 2/2006 | Thieme et al. ............ 505/231 |
| 2006/0049027 | A1 | 3/2006 | Iversen |
| 2006/0073979 | A1 | 4/2006 | Thieme et al. |
| 2006/0125421 | A1 | 6/2006 | Costa |
| 2006/0175078 | A1 | 8/2006 | Yumura et al. |
| 2007/0179063 | A1 | 8/2007 | Malozemoff et al. |
| 2007/0278020 | A1 | 12/2007 | Harris et al. |
| 2008/0103630 | A1 | 5/2008 | Eckroad |
| 2008/0168282 | A1 | 7/2008 | Brundridge |
| 2008/0190646 | A1 | 8/2008 | Folts et al. |
| 2008/0191561 | A1 | 8/2008 | Folts et al. |
| 2008/0194411 | A1 | 8/2008 | Folts et al. |
| 2010/0149707 | A1 | 6/2010 | Folts et al. |
| 2010/0173784 | A1 | 7/2010 | Lee et al. |
| 2011/0177954 | A1 | 7/2011 | Gamble et al. |
| 2012/0110350 | A1 | 5/2012 | Horvath et al. |

FOREIGN PATENT DOCUMENTS

| | | |
|---|---|---|
| DE | 1513827 A1 | 9/1969 |
| EP | 0428993 A2 | 5/1991 |
| EP | 0504895 A2 | 9/1992 |
| EP | 1376709 A1 | 1/2004 |
| GB | 2332558 A | 6/1999 |
| JP | 08088132 A | 4/1996 |
| JP | 2003500985 A | 1/2003 |
| JP | 2003141946 A | 5/2003 |
| JP | 2005150469 A | 6/2005 |
| JP | 2005538672 A | 12/2005 |
| KR | 1020060107273 A | 10/2006 |
| WO | 9403955 A1 | 2/1994 |
| WO | 9929006 A1 | 6/1999 |
| WO | 0070631 A2 | 11/2000 |
| WO | 03047006 A2 | 6/2003 |
| WO | 2004004090 A1 | 1/2004 |
| WO | 2004023623 A1 | 3/2004 |
| WO | 2005029509 A1 | 3/2005 |
| WO | 2007015924 A1 | 2/2007 |

OTHER PUBLICATIONS

Office Action dated Jun. 16, 2010 received in Canadian patent application No. CA2678251 (3 pages).

Office Action (Notification of Reason for Refusal) dated Jul. 6, 2012 received in related Japanese patent application No. 2009549170, (5 pages).

English Translation of Office Action (Notification of Reason for Refusal) dated Jul. 6, 2012 received in related Japanese patent application No. 2009549170, (4 pages).

Ise et al., "Characteristics of a 40K VA three phase superconducting transformer and its parallel operation with a conventional transformer", IEEE Transactions on Applied Superconductivity, Jun. 1995, vol. 5, No. 2 (4 pages).

Poggiani, "Cabling for cryogenic Virgo," VIR-NOT-PIS-1390-340, Issue-I, Mar. 2007, Virgo-Ajoint CNRS-INFN Project, European Gravitational Observatory, Cascina (Italy) (9 pages).

Ritter, "Resistivity of Copper", The Physics Factbook, edited by Glenn Elert, Dec. 2004 (2 pages).

Ugur, "Resistivity of Steel", The Physics Factbook, edited by Glenn Elert, Dec. 2006 (2 pages).

Harris et al., "The Tres Amigas Superstation Project", Nov. 5, 2009, retrieved from internet http://www.tresamigasllc.com/docs/epri-discussion.pdf (46 pages).

Malozemoff, et al., "HTS Wire at Commerical Performance Levels", IEEE transactions on Applied Superconductivity, vol. 9, No. 2, Jun. 1999 (5 pages).

Ishiyama et al., "Normal Transition and Propogation Characteristics of YBCO Tape," IEEE Transactions on Applied Superconductivity, vol. 15, No. 2, Jun. 2005 (4 pages).

Mutlu et al., "Non-Vacuum YBCO Films on Buffer Layered Ni Tapes: Processing, Growth and Properties", IEEE Transactions on Applied Superconductivity, vol. 10, No. 1, Mar. 2000 (4 pgs.).

Lee et al., "Cryogenic Refrigeration System for HTS Cables", IEEE transactions on Applied Superconductivity, vol. 15, No. 2, Jun. 2005, (4 pages).

Office Action dated Jun. 10, 2010 received in Canadian patent application No. CA2677680 (7 pages).

Office Action dated Sep. 30, 2011 received in related Korean patent application No. 10-2011-7019579 (4 pages).

English Translation of Abstract of JP2003141946, (1 page), May 16, 2003.

English Translation of Abstract of JP2003500985 not available, Abstract of corresponding document WO0070631 provided, (1 page), Nov. 23, 2000.

English Translation of Abstract of JP2005538672 not available, Abstract of corresponding document WO2004023623 provided, (1 page), Mar. 18, 2004.

English translation of Abstract of JP2005150469, (1 page), Jun. 9, 2005.

English translation of Abstract of CN1813317, (1 page), Aug. 2, 2006.

English translation of Abstract of KR1020060107273, (1 page), Oct. 13, 2006.

Annex to Form PCT/ISA, Communication relating to the Results of the Partial International Search mailed Apr. 5, 2012, received in International patent application No. PCT/US11/21849, (3 pages).

Schmidt, et al., "Investigation of YBCO Coated Conductors for Fault Current Limiter Applications", IEEE Transactions on Applied Superconductivity, vol. 17, No. 2, Jun. 2007, pp. 3471-3474.

Johnson et al., "An Industrial Power Distribution System Featuring UPS Properties", IEEE, US vol. 4, CONF 24, Jun. 1993, pp. 759-765.

Johnson et al., "High-Temperature Superconducting dc networks", IEEE Transactions on Applied Superconductivity, vol. 4, No. 3, Sep. 1994, pp. 115-120.

International Preliminary Report on Patentability with Written Opinion, mailed Aug. 20, 2009, received in international patent application No. PCT/US08/052307, (7 pages).

(56) References Cited

OTHER PUBLICATIONS

International Preliminary Report on Patentability with Written Opinion, mailed Aug. 20, 2009, received in international patent application No. PCT/US08/052290, (8 pages).
Funaki, K. et al. "Development of a 500 kVA-class Oxide-Superconducting Power Transformer Operated at Liquid-Nitrogen Temperature," Cryogenics, Feb. 1, 1998, pp. 211-220, vol. 38, No. 2.
Zueger, H., "630 kVA High Temperature Superconducting Transformer," Cryogenics, Nov. 1, 1998, pp. 1169-1172, vol. 38, No. 11.
Sykulski, J.K., et al., "Prospects for Large High-Temperature Superconducting Power Transformers: Conclusions From a Design Study," IEE Proceedings: Electric Power Applications, Institution of Electrical Engineers, GB, dated Jan. 11, 1999, pp. 41-52, vol. 146, No. 1.
Reis, C.T., et al., "Development of High Temperature Superconducting Power Transformers," IEEE Power Engineering Society Winter Meeting, Jan. 28, 2001, pp. 432-437.
International Search Report and Written Opinion, dated Jun. 9, 2008, received in international patent application No. PCT/US2008/052307, 14 pgs.
International Search Report and Written Opinion, dated Jun. 10, 2008, received in international patent application No. PCT/US2008/052290, 13 pgs.
Annex to Form PCT/ISAI206, Communication Relating to the Results of the Partial International Search, dated Jun. 12, 2008, received in international patent application No. PCT/US2008/052302, 2 pgs.
Verhaege, et al., "HTS materials for ac current transport and fault current limitation", IEEE Transactions on Applied Superconductivity, Mar. 2001, vol. 11, No. 1, pp. 2503-2506.
Paasi, et al., "Design Performance of a Superconducting Power Link", IEEE Transactions on Applied Superconductivity, Mar. 2001, vol. 11, No. 1, pp. 1928-1931.
Kraemer, et al., "Switching Behavior of YBCO Thin Film Conductors in Resistive Fault Current Limiters", German Federal Ministry for Education, Science and Technology, Aug. 2005 (4 pages).
Serres, et al., "Current Limitation in High Temperature Superconducting Transformers and Impact on the Grid", Cigre Session, 2000 12-205 (6 pages).
Maguire, et al., "Development and Demonstration of a Long Length HTS Cable to Operate in the Long Island Power Authority Transmission Grid", Session 1 L T01 HTS Power Cables-III, pp. 1-7, Manuscript received Oct. 5, 2004 (7 pages).
Noe, et al., "High-temperature superconductor fault current limiters: concepts, applications, and development status", Superconductor Science and Technology 20, R15-R29 (15 pages) (2007).
Usoskin, et al., "SUPEROLI Fault-Current Limiters Based on YBCO-Coated Stainless Steel Tapes", IEEE Transactions on Applied Superconductivity, vol. 13, No. 2, Jun. 2003, pp. 1972-1975 (4 pages).
Zhang, et al., "Development of low thermal conductivity Ag-Au alloy sheath Bi-2223 tape and design of 20 kA HTS current lead" Physica-C, 2004, 412-414, 1217-1220.
Du, et al., "Quench Protection of Bi-2223/Ag Tape Using SFCL made of YBCO thin film," IEEE Transactions on Applied Superconductivity, 17(2), 1891-1894 (Jun. 2007).
Norris, W.T., et al, "Fault Current Limiters Using Superconductors," Cryogenics, Oct. 1, 1997, pp. 657-665, V. 37, No. 10, Elsevier Science Ltd., Great Britain.
International Search Report with Written Opinion, dated Sep. 19, 2008, received in international patent application No. PCT/US2008/052293, 14 pgs.
International Preliminary Report on Patentability with Written Opinion, dated Aug. 20, 2009, received in international patent application No. PCT/US08/052293, 8 pgs.
International Preliminary Report on Patentability with Written Opinion, dated Aug. 20, 2009, received in international patent application No. PCT/US08/052302, 9 pgs.
English translation of Abstract of JP08088132, (1page), Apr. 2, 1996.
Noe, et al., "Supraleitende Strombegrenzer in Der Energietechnik," Elektrie, Jan. 1, 2007, pp. 414-424, V. 51, No. 11/12, Veb Verlag TEchnik, Berlin.
International Search Report with Written Opinion, dated Sep. 17, 2008, received in international patent application No. PCT/US2008/052302, 15 pgs.

\* cited by examiner

FAULT CURRENT LIMITING HTS CABLE AND METHOD OF CONFIGURING SAME

RELATED APPLICATION(S)

This application is a continuation of and claims priority to U.S. patent application Ser. No. 11/688,809, filed Mar. 20, 2007, now U.S. Pat. No. 7,902,461, and entitled "Fault Current Limiting HTS Cable and Method of Configuring Same", which is herein incorporated by reference.

This application is a continuation-in-part of and claims priority to U.S. patent application Ser. No. 11/673,281, filed 9 Feb. 2007, and entitled "Parallel Connected HTS Utility Device and Method of Using Same", which is herein incorporated by reference.

This application claims priority to U.S. patent application Ser. No. 11/688,802, filed 20 Mar. 2007, and entitled "Parallel Connected HTS FCL Device", which is herein incorporated by reference.

This application claims priority to U.S. patent application Ser. No. 11/688,817, filed 20 Mar. 2007, and entitled "HTS Wire", which is herein incorporated by reference.

This application claims priority to U.S. patent application Ser. No. 11/688,827, filed 20 Mar. 2007, now U.S. Pat. No. 7,724,482, issue date: May 25, 2010, and entitled "Parallel HTS Transformer Device", which is herein incorporated by reference.

TECHNICAL FIELD

This disclosure relates to HTS devices and, more particularly, to HTS devices configured to operate as fault current limiting devices.

BACKGROUND

As worldwide electric power demands continue to increase significantly, utilities have struggled to meet these increasing demands both from a power generation standpoint as well as from a power delivery standpoint. Delivery of power to users via transmission and distribution networks remains a significant challenge to utilities due to the limited capacity of the existing installed transmission and distribution infrastructure, as well as the limited space available to add additional conventional transmission and distribution lines and cables. This is particularly pertinent in congested urban and metropolitan areas, where there is very limited existing space available to expand capacity.

Flexible, long-length power cables using high temperature superconducting (HTS) wire are being developed to increase the power capacity in utility power transmission and distribution networks, while maintaining a relatively small footprint for easier installation and using environmentally clean liquid nitrogen for cooling. For this disclosure, an HTS material is defined as a superconductor with a critical temperature at or above 30° Kelvin (minus 243° Centigrade), which includes materials such as rare-earth or yttrium-barium-copper-oxide (herein called YBCO); thallium-barium-calcium-copper-oxide; bismuth-strontium-calcium-copper-oxide (herein called BSCCO); mercury-barium-calcium-copper-oxide; and magnesium diboride. YBCO has a critical temperature approximately 90 K. BSCCO has a critical temperature of approximately 90 K in one composition and approximately 110 K in a second composition. $MgB_2$ has a critical temperature of up to approximately 40 K. These composition families are understood to include possible substitutions, additions and impurities, as long as these substitutions, additions and impurities do not reduce the critical temperature below 30° K. Such HTS cables allow for increased amounts of power to be economically and reliably provided within congested areas of a utility power network, thus relieving congestion and allowing utilities to address their problems of transmission and distribution capacity.

An HTS power cable uses HTS wire as the primary conductor of the cable (i.e., instead of traditional copper conductors) for the transmission and distribution of electricity. The design of HTS cables results in significantly lower series impedance, in their superconducting operating state, when compared to conventional overhead lines and underground cables. Here the series impedance of a cable or line refers to the combination of the resistive impedance of the conductors carrying the power, and the reactive (inductive) impedance associated with the cable architecture or overhead line. For the same cross-sectional area of the cable, HTS wire enables a three to five times increase in current-carrying capacity when compared to conventional alternating current (AC) cables; and up to a ten times increase in current-carrying capacity when compared to conventional direct current (DC) cables.

HTS cables may be designed with HTS wires helically wound around a continuously flexible corrugated former, or they may have multiple HTS wires in a variety of stacked and twisted configurations. In all these cases the cable may be continuously flexible, so that it can be wound conveniently on a drum for transportation and installed with bends and turns in a conduit or between other power devices. HTS cables may be designed with a liquid cryogen in contact with the HTS wires and flowing along the length of the cable. Liquid nitrogen is the most common liquid cryogen, but liquid hydrogen or liquid neon could be used for lower temperature superconducting materials like magnesium diboride.

In addition to capacity problems, another significant problem for utilities resulting from increasing power demand (and hence increased levels of power being generated and transferred through the transmission and distribution networks) are increased "fault currents" resulting from "faults". Faults may result from network device failures, acts of nature (e.g. lightning), acts of man (e.g. an auto accident breaking a power pole), or any other network problem causing a short circuit to ground or from one phase of the utility network to another phase. In general, such a fault appears as an extremely large load materializing instantly on the utility network. In response to the appearance of this load, the network attempts to deliver a large amount of current to the load (i.e., the fault). Any given link in the network of a power grid may be characterized by a maximum fault current which will flow, in the absence fault current limiting measures. during the short circuit that precipitates the maximum fault condition. The fault currents may be so large in large power grids that without fault current limiting measures, most electrical equipment in the grid may be damaged or destroyed. The conventional way of protecting against fault currents is to rapidly open circuit breakers and completely stop the current and power flow.

Detector circuits associated with circuit breakers monitor the network to detect the presence of a fault (or over-current) situation. Within a few milliseconds of detection, activation signals from the detector circuits may initiate the opening of circuit breakers to prevent destruction of various network components. Currently, the maximum capability of existing circuit breaker devices is 80,000 amps, and these are for transmission level voltages only. Many sections of the utility network built over the previous century were built with network devices capable of withstanding only 40,000 to 63,000 amps of fault current. Unfortunately, with increased levels of power generation and transmission on utility networks, fault current levels are increasing to the point where they will exceed the capabilities of presently installed or state-of-the-art circuit breaker devices (i.e., be greater than 80,000 amps) both at distribution and transmission level voltages. Even at lower fault current levels, the costs of upgrading circuit breakers from one level to a higher one across an entire grid can be very high. Accordingly, utilities are looking for new solutions to deal with the increasing level of fault currents. In most cases, it is desirable to reduce fault currents by at least 10% to make a meaningful improvement in the operation of a grid. One such solution in development is a device called an HTS fault current limiter (FCL).

An HTS FCL is a dedicated device interconnected to a utility network that reduces the amplitude of the fault currents to levels that conventional, readily available or already installed circuit breakers may handle. See *High-Temperature Superconductor Fault Current Limiters* by Noe and M. Steurer, Supercond. Sci. Technol. 20 (2007) R15-R29. Such HTS FCLs have typically been configured out of short rigid modules made of solid bars or cylinders of HTS material which have very high resistance when they are driven over their superconducting critical current into a resistive state. Unfortunately, such standalone HTS FCLs are currently quite large and expensive. Space is particularly at a premium in substations in dense urban environments where HTS cables are most needed. Utilities may also use large inductors, but they may cause extra losses, voltage regulation and grid stability problems. And, unfortunately, pyrotechnic current limiters (e.g., fuses) need replacement after every fault event. Further, while new power electronic FCLs are under development, there are questions about whether they can be fail-safe and whether they can be extended reliably to transmission voltage levels.

To allow HTS cables to survive the flow of fault currents, a significant amount of copper is introduced in conjunction with the HTS wire, but this adds to the weight and size of the cable. See *Development and Demonstration of a Long Length HTS Cable to Operate in the Long Island Power Authority Transmission Grid* by J. F. Maguire, F. Schmidt, S. Bratt, T. E. Welsh, J. Yuan, A. Allais, and F. Hamber, to be published in IEEE Transaction on Applied Superconductivity. Often, copper fills the central former in the core of the HTS cable around which the HTS wire is helically wound, which prevents the core from being used as a passage for the flow of liquid nitrogen. Alternatively, especially for multi-phase cables, copper wires are mixed in with the HTS wires within the helically wound layers of the cable. These copper wires or structures may be electrically in parallel with the HTS wires and may be called "copper shunts" within the HTS cable. In the presence of a large fault current that exceeds the critical current of the HTS wires of the cable, they quench or switch to a resistive state that can heat from resistive $I^2R$ losses (where I is the current and R is the resistance of the cable). These copper shunts may be designed to absorb and carry the fault current to prevent the HTS wires from over-heating. The amount of copper is so large that its total resistance in the cable is comparatively small and, therefore, has a negligible effect in reducing the fault current. Copper may be defined to mean pure copper or copper with a small amount of impurities such that its resistivity is comparatively low in the 77-90 K temperature range (e.g., <0.5 microOhm-cm, or as low as 0.2 microOhm-cm.

In the European SUPERPOLI program (See *SUPERPOLI Fault-Current Limiters Based on YBCO-Coated Stainless Steel Tapes* by A. Usoskin et al., IEEE Trans. on Applied Superconductivity, Vol. 13, No. 2, June 2003, pp. 1972-5; *Design Performance of a Superconducting Power Link* by Paasi et al., IEEE Trans. on Applied Superconductivity, Vol. 11, No. 1, March 2001, pp. 1928-31; *HTS Materials of AC Current Transport and Fault Current Limitation* by Verhaege et al., IEEE Trans. on Applied Superconductivity, Vol. 11, No. 1, March 2001, pp. 2503-6; and U.S. Pat. No. 5,859,386, entitled "Superconductive Electrical Transmission Line"), superconducting power links were investigated that may also limit current.

Following the typical approach for earlier standalone FCLs, this program investigated rigid solid rods or cylinders of HTS material that formed modules or busbars for the power link. A typical length of a module or busbar was 50 cm to 2 meters. In a second approach, coated conductor wire was used in which YBCO material was coated on high resistance stainless steel substrates. A gold stabilizer layer was used, but it was kept very thin to keep the resistance per length as high as possible. The wire was helically wound on a rigid cylindrical core which formed another option for a module or busbar for the power link. In response to a fault current, both these modules switch to a very highly resistive state to limit the current. The concept proposed in the SUPERPOLI program to create a longer length cable was to interconnect the rigid modules with flexible braided copper interconnections. See U.S. Pat. No. 5,859,386, entitled "Superconductive Electrical Transmission Line". The possibility of designing and fabricating a long-length continuously flexible cable with fault-current-limiting functionality using lower resistance and higher heat capacity wires, and hence a lower level of local heating, was not considered. Nor was the possibility of additional grid elements that could optimize the functionality of the link.

It is desirable to improve the way in which HTS cables handle fault currents and to provide an improved alternative to the use of standalone FCLs or other fault current limiting devices such as high resistance-per-length fault-current limiting modules forming power links. A practical long-length continuously flexible HTS power cable that incorporates fault current limiting functionality would provide major benefits in establishing high capacity, low footprint and environmentally clean power transmission and distribution, while at the same time avoiding the necessity for separate and costly fault-current-limiting devices in crowded utility substations.

SUMMARY OF DISCLOSURE

In a first implementation of this disclosure, a cryogenically-cooled HTS cable is configured to be included within a utility power grid having a maximum fault current that would occur in the absence of the cryogenically-cooled HTS cable. The cryogenically-cooled HTS cable includes a continuous liquid cryogen coolant path for circulating a liquid cryogen. A continuously flexible arrangement of HTS wires has an impedance characteristic that attenuates the maximum fault current by at least 10%. The continuously flexible arrangement of HTS wires is configured to allow the cryogenically-cooled HTS cable to operate, during the occurrence of a maximum fault condition, with a maximum temperature rise within the HTS wires that is low enough to prevent the formation of gas bubbles within the liquid cryogen.

One or more of the following features may be included. The cryogenically-cooled HTS cable may include a continuously flexible winding support structure. One or more of the HTS wires may be positioned coaxially with respect to the continuously flexible winding support structure. The continuously flexible winding support structure may include a hollow axial core. The continuously flexible winding support structure may include a corrugated stainless steel tube.

A shield layer may be positioned coaxially with respect to continuously flexible winding support structure. An insulation layer may be positioned coaxially with respect to the continuously flexible winding support structure and positioned between the one or more conductive layers and the shield layer. The liquid cryogen may be liquid nitrogen. The liquid nitrogen may be pressurized above atmospheric pressure and may be subcooled below 77 K. The liquid cryogen may be liquid hydrogen.

The cryogenically-cooled HTS cable may include one or more HTS wires. At least one of the HTS wires may be constructed of an HTS material chosen from the group consisting of: yttrium or rare-earth-barium-copper-oxide; thallium-barium-calcium-copper-oxide; bismuth-strontium-calcium-copper-oxide; mercury-barium-calcium-copper-oxide; and magnesium diboride. At least one of the one or more HTS wires may include at least one stabilizer layer having a total stabilizer thickness within a range of 100-600 micrometers and a resistivity within a range of 0.8-15.0 microOhm-cm at 90° K. At least one of the one or more HTS wires may include at least one stabilizer layer having a total stabilizer thickness within a range of 200-500 micrometers and a resistivity within a range of 1-10.0 microOhm-cm at 90° K. An impedance characteristic and a maximum temperature rise during a fault condition may be defined by configuring one or more design parameters of one or more of the HTS wires. The one or more design parameters may include one or more of: a stabilizer resistivity factor; a stabilizer thickness factor; a wire specific heat factor; and an operating critical current density factor.

One or more high speed switches may be coupled in series with the cryogenically-cooled HTS cable. The one or more high speed switches may be configured to be opened after the onset of a fault condition. The cryogenically-cooled HTS cable may be configured to be used in a bus-tie application that links a plurality of substations.

In another implementation of this disclosure, a method of configuring a cryogenically-cooled HTS cable includes determining a maximum allowable operating temperature for the cryogenically-cooled HTS cable. The cryogenically-cooled HTS cable includes a flexible winding support structure configured to support one or more conductive layers of superconducting material positioned coaxially with respect to the flexible winding support structure. One or more design parameters of the cryogenically-cooled HTS cable are configured so that, during the occurrence of a maximum fault condition, an actual operating temperature of the cryogenically-cooled HTS superconducting cable is maintained at a level that is less than the maximum allowable operating temperature, and the maximum fault current is reduced by at least 10%.

One or more of the following features may be included. The maximum allowable operating temperature may essentially correspond to the temperature at which a refrigerant circulating within at least a portion of the cryogenically-cooled HTS cable changes from a liquid state to a gaseous state. The refrigerant may be pressurized liquid nitrogen. The one or more design parameters may include one or more of: a wire resistivity factor; a stabilizer thickness factor; a specific heat factor; a fault current duration factor; and a wire operating critical current per unit width factor. The actual operating temperature of the cryogenically-cooled HTS cable may be determined. The actual operating temperature of the cryogenically-cooled HTS cable may be compared to the maximum allowable operating temperature for the cryogenically-cooled HTS cable.

Configuring one or more design parameters may include adjusting an impedance of the cryogenically-cooled HTS cable. Adjusting the impedance of the cryogenically-cooled HTS superconducting cable may include one or more of: adjusting a length of the cryogenically-cooled HTS cable above a minimum value; adjusting a resistivity of the cryogenically-cooled HTS cable; adjusting a thickness of a stabilizer layer bonded to an HTS wire within the cryogenically-cooled HTS cable; adjusting a specific heat of an HTS wire by means of an encapsulant in the cryogenically-cooled HTS cable; and adjusting an operating critical current density of an HTS wire included within the cryogenically-cooled HTS cable.

The stabilizer layer may be constructed, at least in part, of a brass material. The cryogenically-cooled HTS superconducting cable may include one or more HTS wires. At least one of the HTS wires may be constructed of a material chosen from the group consisting of: yttrium or rare-earth-barium-copper-oxide; thallium-barium-calcium-copper-oxide; bismuth-strontium-calcium-copper-oxide; mercury-barium-calcium-copper-oxide; and magnesium diboride. The cryogenically-cooled HTS superconducting cable may be coupled to a voltage source having a voltage source impedance. The voltage source impedance of the voltage source may be determined.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF EXEMPLARY EMBODIMENTS

Overview

Figure 1:
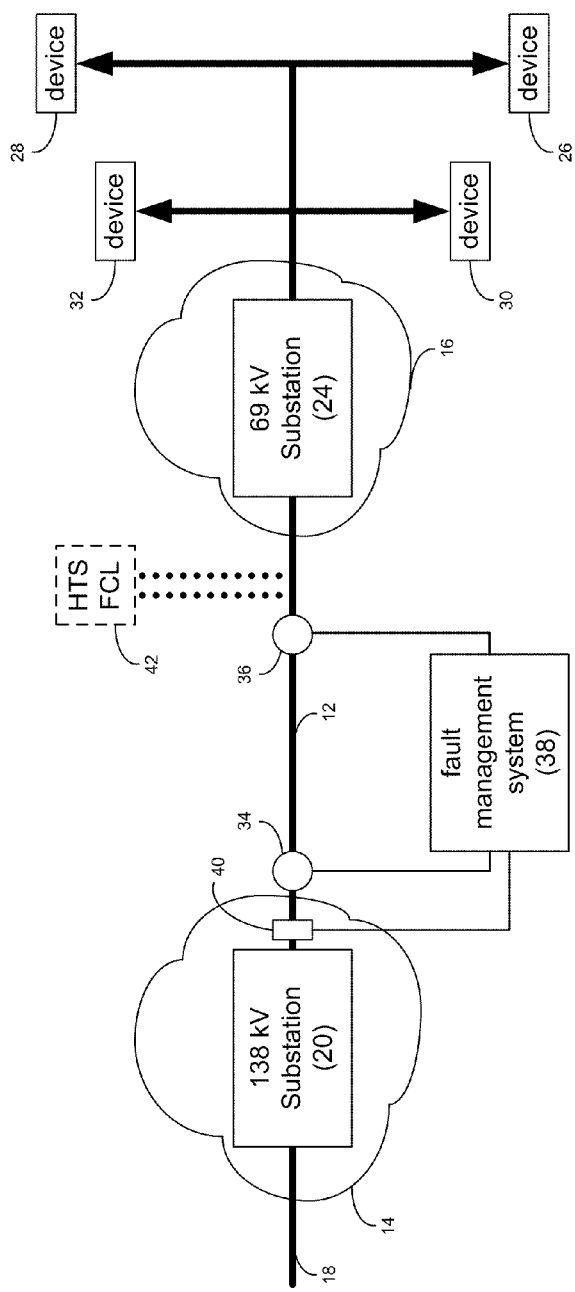
FIG. 1 is a schematic diagram of a copper-cored HTS cable system installed within a utility power grid.

Referring to FIG. 1, a portion of a utility power grid 10 may include a high temperature superconductor (HTS) cable 12. HTS cable 12 may be hundreds or thousands of meters in length and may provide a relatively high current/low resistance electrical path for the delivery of electrical power from generation stations (not shown) or imported from remote utilities (not shown).

The cross-sectional area of HTS cable 12 may only be a fraction of the cross-sectional area of a conventional copper core cable and may be capable of carrying the same amount of electrical current. As discussed above, within the same cross-sectional area, an HTS cable may provide three to five times the current-carrying capacity of a conventional AC cable; and up to ten times the current-carrying capacity of a conventional DC cable. As HTS technology matures, these ratios may increase.

As will be discussed below in greater detail, HTS cable 12 includes HTS wire, which may be capable of handling as much as one-hundred-fifty times the electrical current of similarly-sized copper wire. Accordingly, by using a relatively small quantity of HTS wire (as opposed to a large quantity of copper conductors stranded within the core of a traditional AC cable), an HTS power cable may be constructed that is capable of providing three to five times as much electrical power as an equivalently-sized traditional copper-conductor power cable.

HTS cable 12 may be connected within a transmission grid segment 14 that carries voltages at a level of e.g., 138 kV and extends from grid segment 14 to grid segment 16, which may receive this voltage and transform it to a lower level of e.g., 69 kV. For example, transmission grid segment 14 may receive power at 765 kV (via overhead line or cable 18) and may include a 138 kV substation 20. 138 kV substation 20 may include a 765 kV/138 kV transformer (not shown) for stepping down the 765 kV power received on cable 18 to 138 kV. This "stepped-down" 138 kV power may then be provided via e.g., HTS cable 12 to transmission grid segment 16. Transmission grid segment 16 may include 69 kV substation 24, which may include a 138 kV/69 kV transformer (not shown) for stepping down the 138 kV power received via HTS cable 12 to 69 kV power, which may be distributed to e.g., devices 26, 28, 30, 32. Examples of devices 26, 28, 30, 32 may include, but are not limited to 34.5 kV substations.

The voltage levels discussed above are for illustrative purposes only and are not intended to be a limitation of this disclosure. Accordingly, this disclosure is equally applicable to various voltage and current levels in both transmission and distribution systems. Likewise, this disclosure is equally applicable to non-utility applications such as industrial power distribution or vehicle power distribution (e.g. ships, trains, aircraft, and spacecraft).

One or more circuit breakers 34, 36 may be connected on e.g., each end of HTS cable 12 and may allow HTS cable 12 to be quickly disconnected from utility power grid 10. Fault management system 38 may provide over-current protection for HTS cable 12 to ensure that HTS cable 12 is maintained at a temperature that is below the point at which HTS cable 12 may be damaged.

Fault management system 38 may provide such over-current protection by monitoring the current flowing in the segment of the utility grid to which HTS cable 12 is coupled. For example, fault management system 38 may sense the current passing through 138 kV substation 20 (using e.g., current sensor 40) and may control the operation of breakers 34, 36 based, at least in part, on the signal provided by current sensor 40.

In this example, HTS cable 12 may be designed to withstand a fault current as high as 51 kA with a duration of 200 ms (i.e., 12 cycles of 60 Hz power). The details of fault management system 38 are described in co-pending U.S. patent application Ser. No. 11/459,167, which was filed on 21 Jul. 2006, and is entitled Fault Management of HTS Power Cable. Typically, in order to withstand this level of fault current, the HTS cable may contain a significant amount of copper, which may help to carry the high fault current and thus protect the HTS wires. The copper is present to protect the HTS cable, but it has no significant current limiting effect because of its very low resistance.

Figure 2:
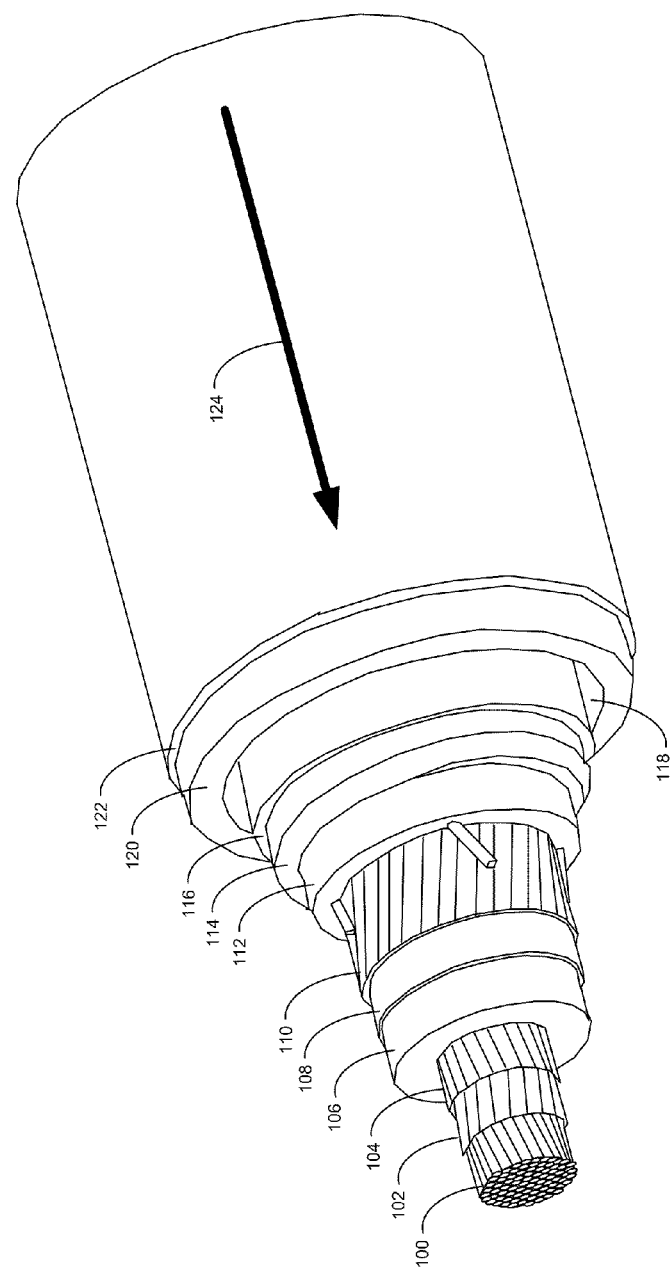
FIG. 2 is an isometric view of the copper-cored HTS cable of FIG. 1.

Referring also to FIG. 2, there is shown a typical embodiment of a single-phase copper-cored HTS cable 12 that may include stranded copper core 100 surrounded in radial succession by first HTS layer 102, second HTS layer 104, high voltage dielectric insulation layer 106, copper shield layer 108, HTS shield layer 110, coolant passage 112, inner cryostat wall 114, thermal insulation 116, vacuum space 118, outer cryostat wall 120 and an outer cable sheath 122. HTS layer 102 and HTS layer 104 may also be referred to as "phase conductors". Copper shield layer 108 may alternatively be positioned on the outside of HTS shield layer 110. During operation, a refrigerant or liquid cryogen (e.g., liquid nitrogen, not shown) may be supplied from an external coolant source (not shown) and may be circulated within and along the length of coolant passage 112. All components of the cable are designed so as to enable flexibility of HTS cable 12. For example, stranded copper core 100 (upon which first HTS layer 102 and second HTS layer 104 are wound) is flexible. Accordingly, by utilizing flexible stranded copper core 100, an HTS cable 12 is realized that is continuously flexible along its length. Optionally, a corrugated metal former may be used to support the helically wound HTS wires, providing continuous flexibility along the length of the cable.

Additionally/alternatively, additional coaxial HTS and insulation layers may be utilized. For example, more than two layers of HTS wires may be used for a single phase. Also, three groups of HTS layers separated by insulation layers (not shown) may be utilized to carry three-phase power. An example of such a cable arrangement is the Triax HTS Cable arrangement proposed by Ultera (i.e., a joint venture of Southwire Company of Carrollton, Ga. and nkt cables of Cologne, Germany). Other embodiments of HTS cable 12 may include, but are not limited to: warm and/or cold dielectric configurations; single-phase vs. multi-phase configurations; and various shielding configurations (e.g., no shield and cryostat-based shielding).

Copper core 100 and copper shield layer 108 may be configured to carry fault currents (e.g., fault current 124) that may appear within cable 12. For example, when fault current 124 appears within cable 12, the current within HTS layers 102, 104 may dramatically increase to a level that exceeds the critical current level (i.e., $I_c$) of HTS layers 102, 104, which may cause HTS layers 102, 104 to lose their superconducting characteristics (i.e., HTS layers 102, 104 may go "normal"). A typical value for critical current level $I_c$ is 4,242 $A_{peak}$ for a cable rated at 3000 $A_{rms}$ (where $A_{rms}$ refers to root-mean-square Amperes of current).

The critical current level in HTS materials may depend upon the choice of electric field level. Conventionally, the critical current level $I_c$ is defined as an electric field level of 1 microvolt/cm, though lower values are also used. However, typical superconductors exhibit a transition region between the zero-resistance (i.e., superconducting) and fully-resistive (i.e., non-superconducting) states as a function of current level. Conductor losses resulting from operation in this transition region are below those of the fully-resistive state. Therefore, in practice, portions of conductor in the HTS cable may switch to the fully resistive state at a critical current level that is a factor ("f") times the conventional critical current level $I_c$ defined by the 1 microvolt/cm criterion. In meander line wires with YBCO thin films, this factor was determined to be approximately 2, but it was observed to vary somewhat with time. See *Switching Behavior of YBCO Thin Film Conductors in Resistive Fault Current Limiters* by H. -P. Kraemer et al., IEEE Trans. on Applied Superconductivity, vol. 13, No.

2, June 2003, pp. 2044-7. The f-factor for HTS wires with similar YBCO thin films is anticipated to be in a similar range (e.g., 1-4).

Accordingly, when the product of the critical current level (as defined above) and the f-factor is exceeded, the resistance of HTS layers 102, 104 may increase significantly and may become comparatively high (i.e., when compared to copper core 100). As the current passing through a plurality of parallel conductors is distributed inversely with respect to the resistance of the individual conductors, the majority of fault current 124 may be diverted to copper core 100, which is connected in parallel with HTS layers 102, 104. This transmission of fault current 124 through copper core 100 may continue until: fault current 124 subsides; or the appropriate circuit breakers (e.g., circuit breakers 34, 36) interrupt the transmission of fault current 124 through HTS cable 12.

Overheating of the HTS conductors in HTS cable 12 may be avoided by two benefits provided by the copper core 100. First, by redirecting fault current 124 (or at least a portion thereof) from HTS layers 102, 104 to copper core 100, the overheating of the HTS conductors in HTS cable 12 may be avoided. And second the added heat capacity of copper core 100 reduces the temperature rise in HTS layers 102 and 104. In the event that fault current 124 (or at least a portion thereof) was not redirected from HTS layers 102, 104 to copper core 100, fault current 124 may heat the HTS conductors in HTS cable 12 significantly due to the high resistance of HTS layers 102, 104, which may result in the formation of gaseous "bubbles" of liquid nitrogen (i.e., due to liquid nitrogen being converted from a liquid state to a gaseous state within coolant passage 112). Unfortunately, the formation of gaseous "bubbles" of liquid nitrogen may reduce the dielectric strength of the dielectric layer and may result in voltage breakdown and the destruction of HTS cable 12. For warm dielectric cable configurations (not shown), fault current not redirected away from HTS layers 102, 104 may simply overheat and destroy HTS layers 102, 104.

Examples of HTS cable 12 may include but are not limited to HTS cables available from Nexans of Paris France; Sumitomo Electric Industries, Ltd., of Osaka, Japan; and Ultera (i.e., a joint venture of Southwire Company of Carrollton, Ga. and NKT cables of Cologne, Germany).

While copper core 100 redirects fault currents (or portions thereof) around HTS layers 102, 104, there are disadvantages to utilizing such an "internal" copper core. For example, copper core 100 may require HTS cable 12 to be physically larger and heavier, which may result in increased cost and greater heat retention within HTS cable 12. Accordingly, more refrigeration may be required to compensate for the additional heat retention, resulting in higher overall system and operating costs. Moreover, the increased heat capacity of copper core 100, and the thermal resistance between the HTS layers 102, 104, and the coolant due to the dielectric layer may greatly increase recovery times should the energy of a fault current increase the temperature beyond the point where superconductivity can be maintained in HTS layers 102, 104. For example, in the event that a fault current is redirected through copper core 100, it may take several hours for the refrigeration system (not shown) to cool down HTS cable 12 to within the appropriate operating temperature range (e.g., 65-77° Kelvin). The time required to cool down HTS cable 12 to within the operating range of the cable is commonly referred to as the "recovery time", which may be required by utilities to be as short as possible (e.g. seconds). Alternatively, a standalone fault current limiter may be used with HTS cable 12 to limit fault currents; however this has the disadvantage of requiring another large and costly piece of electrical equipment to be installed in the substation linked to HTS cable 12.

Figure 3:
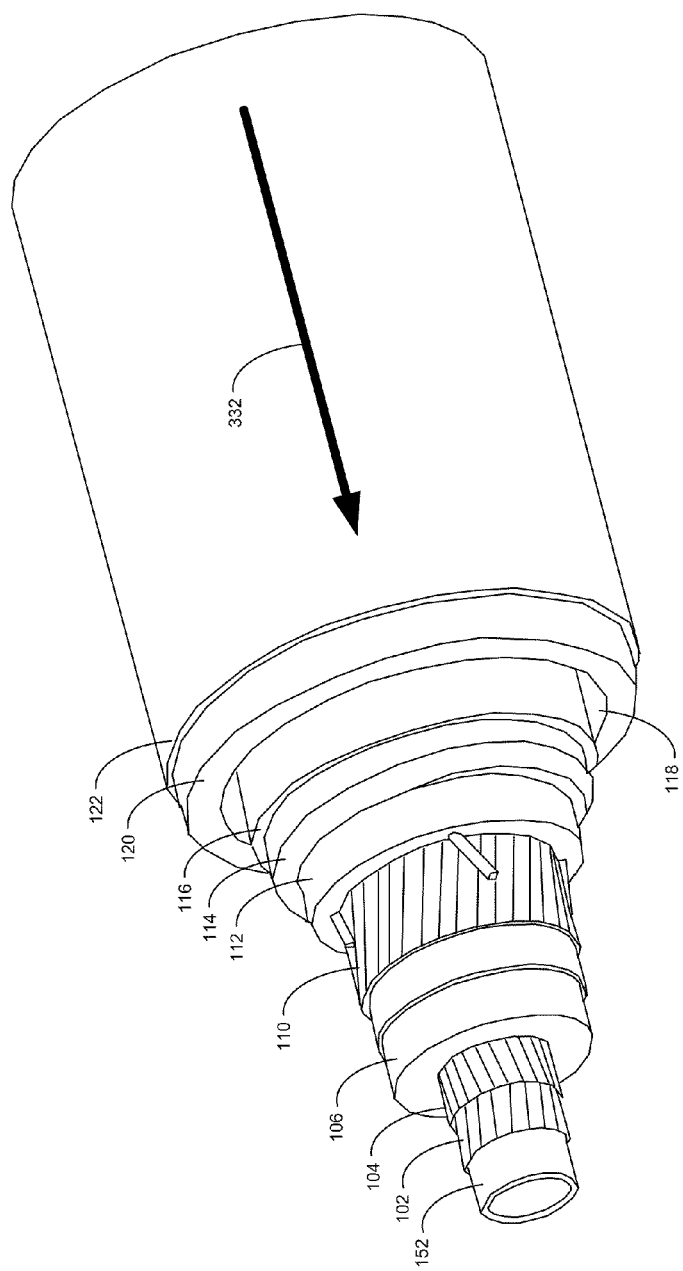
FIG. 3 is an isometric view of a hollow-core HTS cable.

Referring to FIG. 3, there is shown a flexible, hollow-core HTS cable 150, according to this disclosure. While HTS cable 150 may include various components of prior art copper-cored HTS cable 12, HTS cable 150 does not include stranded copper core 100 (FIG. 2), which was replaced with a flexible hollow core (e.g., inner coolant passage 152). An example of inner coolant passage 152 may include, but is not limited to, a flexible, corrugated stainless steel tube. All copper shield layers are removed as well. A refrigerant (e.g., liquid nitrogen) may flow through inner coolant passage 152.

In a fashion similar to that of copper-cored HTS cable 12, inner coolant passage 152 may be surrounded in radial succession by first HTS layer 102, second HTS layer 104 (usually helically wound with the opposite helicity of layer 102), high voltage dielectric insulation layer 106, HTS shield layer 110, coolant passage 112, inner cryostat wall 114, thermal insulation 116, vacuum space 118, outer cryostat wall 120 and an outer cable sheath 122. During operation, a refrigerant (e.g., liquid nitrogen, not shown) may be supplied from an external coolant source (not shown) and may be circulated within and along the length of coolant passage 112 and inner coolant passage 152. An alternative coolant (e.g., liquid neon or liquid hydrogen) may be used in the case of lower transition temperature materials like $MgB_2$.

As with HTS cable 12, all components of HTS cable 150 are designed so as to enable flexibility continuously along the length of the cable. For example and as discussed above, inner coolant passage 152 (upon which first HTS layer 102 and second HTS layer 104 are wound) is flexible. Accordingly, by utilizing flexible inner coolant passage 152, a flexible HTS cable 150 is realized.

Figure 4:
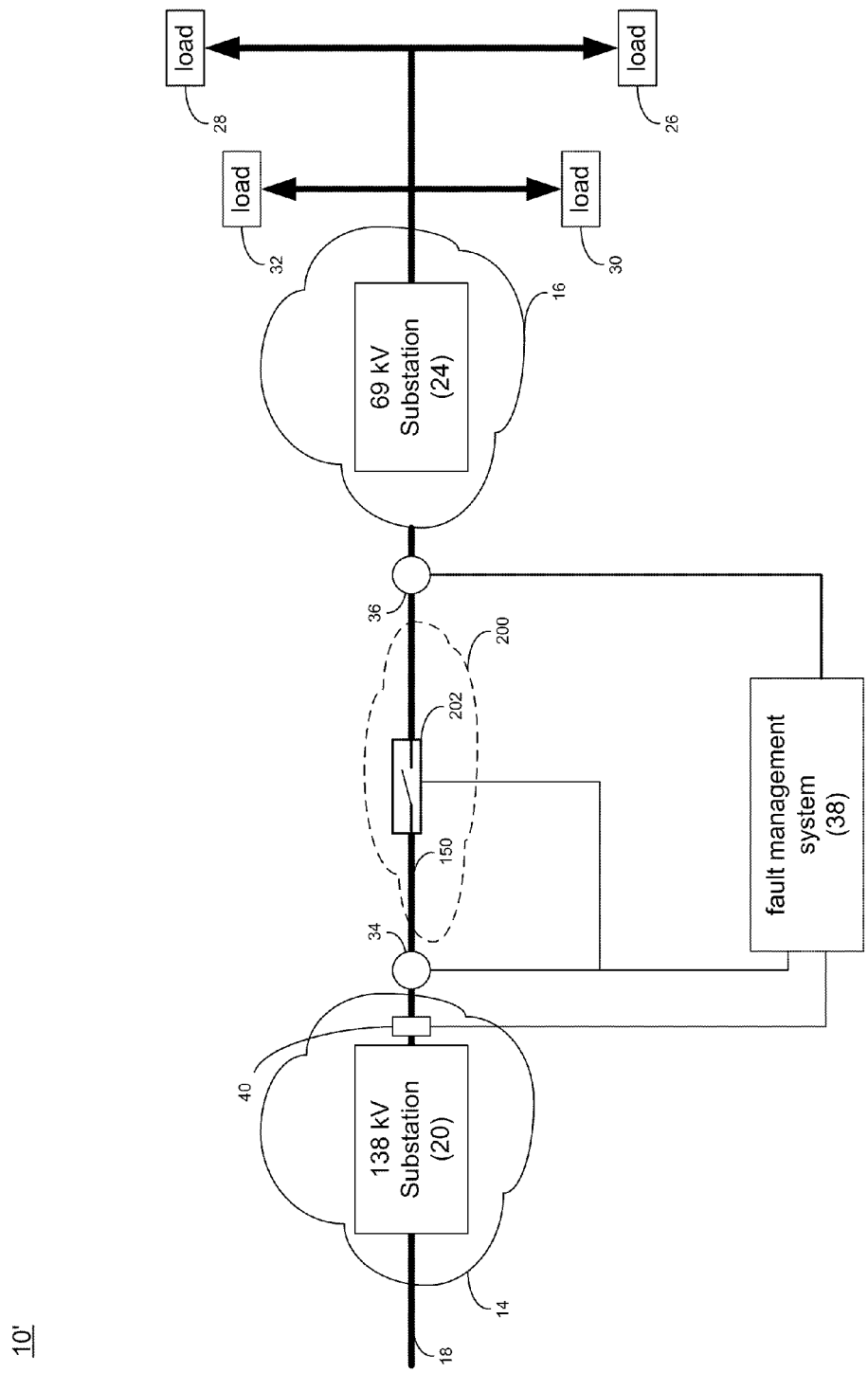
FIG. 4 is a schematic diagram of the hollow-core HTS cable of FIG. 3 installed within a utility power grid.

Referring also to FIG. 4, utility power grid portion 10' may include flexible, long-length HTS cable 150. Here long-length is defined as greater than 200 m. It may also include a conventional (i.e. non-superconducting cable, not shown), connected in parallel with HTS cable 150. An example of the conventional cable may include but is not limited to a 500 kcmil, 138 kV Shielded Triple Permashield (TPS) power cable available from The Kerite Company of Seymour, Conn. The conventional cable may be an existing cable in a retrofit application where HTS cable 150 is being added to replace one or more conventional cables to e.g., increase the power capacity of an electrical grid. Alternatively, the conventional cable may be a new conventional cable that is installed concurrently with HTS cable 150 and interconnected with appropriate bus work and circuit breakers.

HTS cable 150 and/or additional HTS cables (not shown) may be included within superconducting electrical path 200, which may include a portion of a utility power grid. Further, superconducting electrical path 200 may include other superconducting power distribution devices, such as buses (not shown), transformers (not shown), fault current limiters (not shown), and substations (not shown).

A fast switch assembly 202 may be coupled in series with HTS cable 150. An example of fast switch assembly 202 is a 138 kV Type PM Power Circuit Breaker manufactured by ABB Inc. of Greensburg, Pa. Fast switch assembly 202 (e.g., a switch capable of opening in 4 cycles) may be controllable by fault management system 38. For example, upon sensing fault current 124 (FIG. 3), fault management system 38 may open fast switch assembly 202, resulting in HTS cable 150 being essentially isolated from fault current 124. For multiphase power, a plurality of fast switch assemblies 202 may be utilized. Alternatively, some fast switch assemblies or circuit breakers are built as a single three-phase device. Fast switch assembly 202 may be reclosed after a time sufficient to allow HTS cable 150 to recover to its superconducting state. If existing utility circuit breakers 34, 36 switch quickly enough to meet the heating requirements discussed below, fast switch assembly 202 may not be required.

The conventional cable (not shown) and/or additional conventional cables (not shown) may be included within a non-superconducting electrical path, which may include a portion of a power utility grid. Further, the non-superconducting electrical path may include other power distribution devices, such as buses (not shown), transformers (not shown), fault current limiters (not shown), and substations (not shown). The non-superconducting electrical path may be maintained at a non-cryogenic temperature (e.g., a temperature of at least 273 K, which corresponds to 0° C.). For example, the non-superconducting electrical path may not be cooled and, therefore, may assume ambient temperature.

As will be discussed below in greater detail, by removing copper core 100 (FIG. 2) and copper shield layer 108 (FIG. 2) from the inside of the flexible, long-length HTS cable 150 and by controlling the impedance of HTS cable 150, HTS cable 150 may be physically smaller, which may result in decreased fabrication cost and lower heat loss from HTS cable 150. Accordingly, HTS cable 150 may require less refrigeration (when compared to copper-cored HTS cable 12) and may result in lower overall system and operating costs. Further, by removing copper core 100 from the inside of HTS cable 150, the heat capacity of HTS cable 150 and the thermal resistance between HTS layers 102, 104 and the coolant may both be reduced, thus allowing for quicker recovery times in the event that fault current 124 increase the temperature of HTS cable 150 beyond the point where superconductivity may be maintained in HTS layers 102, 104. By removing copper core 100 from the inside of the flexible, long-length HTS cable 150 and by controlling the impedance of HTS cable 150, one can incorporate fault current limiting functionality directly into HTS cable 150, thus removing the need for a separate standalone fault current limiter if one wants to protect the HTS cable or downstream utility equipment from fault currents.

HTS Cable and Fault Current Limiters

Referring again to FIG. 1, if a fault current within grid section 10 causes the current flowing through HTS cable 12 to rise beyond the limits of conventional circuit breakers 34, 36, an HTS FCL device 42 (shown in phantom) or conventional reactor technology (not shown) may be incorporated within grid section 10 to limit the amplitude of the fault current flowing through HTS cable 12 to a level that conventional circuit breakers 34, 36 can interrupt. Under normal conditions, when nominal current levels are flowing in grid section 10, HTS FCL device 42, which is connected in series with the power flow, may be designed to introduce very low impedance into the grid (compared to other grid impedances). However, when a fault current appears in grid section 10, the current causes the superconductor in HTS FCL 42 to instantaneously go "normal" or non-superconducting (i.e., resistive), and this adds a very large impedance into grid section 10. HTS FCL 42 may be designed to limit the fault current to a predetermined level that is within the interrupting capability of conventional circuit breakers 34, 36.

Standalone HTS FCL devices 42 are being developed by various companies, including American Superconductor Corporation (of Westboro, Mass.) in conjunction with Siemens AG (of Germany). Unfortunately, adding HTS FCL device 42 to grid section 10 may be costly and may require a significant amount of space to accommodate device 42, which may be difficult to accommodate, especially in urban areas. Short busbars or modules with fault current limiting capability are being developed by various companies, including Nexans (of France) and EHTS (of Germany). While fault current limiting busbars may have certain applications, they do not provide the sought-after high capacity, low footprint and flexibility that is provided by long-length continuously flexible cables for transmission and distribution applications.

According to the present disclosure, an HTS device e.g. continuously flexible, long-length HTS cable 150 (FIG. 3), when properly designed, may be used as a fault current limiter itself without the need to incorporate a separate HTS FCL, such as HTS FCL device 42 (FIG. 1). By controlling e.g., the normal-state (resistive) impedance of HTS cable 150, the HTS cable itself may be utilized to obtain the desirable effects (e.g., attenuation of fault currents) of a typical standalone HTS FCL device (e.g., HTS FCL 42) while avoiding the undesirable effects (e.g., cost and size) of the typical standalone HTS FCL device. Specifically and as will be discussed below in greater detail, if the length of HTS cable 150 is sufficiently long and if HTS cable 150 is manufactured to exhibit desired impedance characteristics, continuously flexible, long-length HTS cable 150 alone may provide significant attenuation of fault current 124 (FIG. 3) without heating to the point to create gas bubbles in the liquid cryogen and risking dielectric breakdown.

Overview of Fault Current Limiting (FCL) HTS Cable and Design of HTS Wire for FCL Cable As will be discussed below in greater detail, by controlling various parameters of flexible long-length HTS cable 150 (e.g., the electrical resistivity and stabilizer thickness of the HTS wires within cable 150), an HTS cable may be realized that simultaneously 1) provides the required net resistance to achieve significant reduction of fault current in the cable, and 2) maintains the fault-current-induced temperature rise throughout HTS cable 150 at a level that is below a maximum value that prevents the bubbling of the liquid nitrogen coolant circulating within the cable. As discussed above, the formation of gaseous "bubbles" of liquid nitrogen may reduce the dielectric strength of the dielectric layer of HTS cable 150 and may result in voltage breakdown and the destruction of HTS cable 150.

Electrical resistivity, which may also be known as specific electrical resistance, is a measure of how strongly a material opposes the flow of electric current. Specifically, a low electrical resistivity may indicate a material that readily allows for the movement of electrical charge. A convenient measure of resistivity is microOhm-cm.

As will be discussed below in greater detail, the structure of HTS cable 150 and the design of the HTS wire within HTS cable 150 differ fundamentally from the designs that have been proposed for standalone HTS FCLs or fault-current-limiting busbars.

Figure 5A:
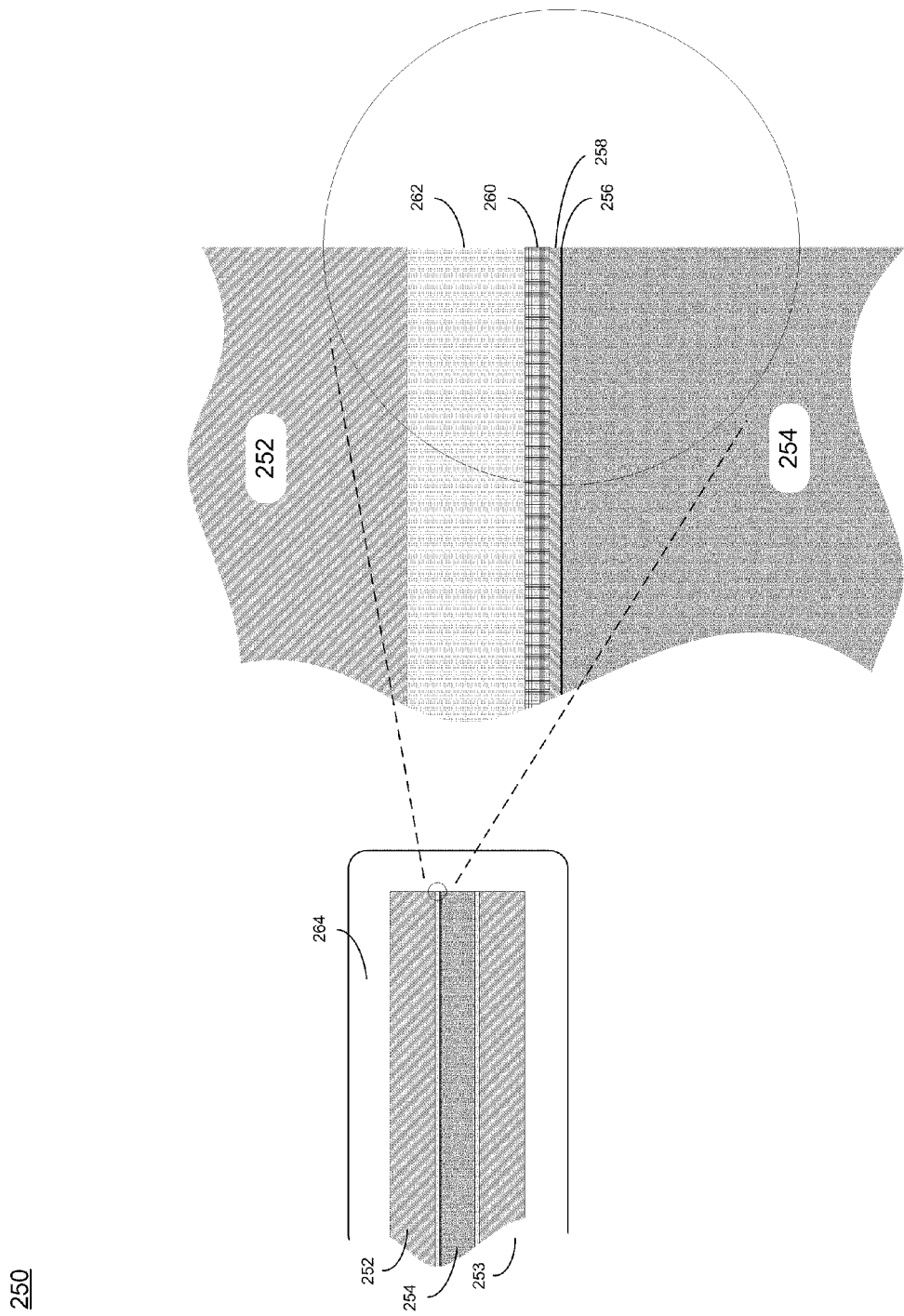
FIG. 5A is a cross-sectional view of an HTS wire.

Referring also to FIG. 5, there is shown a cross-sectional view of one HTS wire 250 used to construct HTS layers 102, 104 of fault-current-limiting HTS cable 150. This wire architecture may also be called a "coated wire" architecture because a thin layer of superconductor (i.e., an HTS layer) is coated onto a buffered substrate. Typically, the HTS layer comprises the superconductor YBCO, as defined earlier, in particular the composition $YBa_2Cu_3O_7$ with possible substitutions of rare earth elements for Y. It is understood that the overall composition may differ from this composition because impurity phases may be present in the layer. Other HTS materials can also be used in a coated conductor architecture.

In this example, HTS wire 250 used in HTS layers 102, 104 is shown to include two stabilizer layers 252, 253 and substrate layer 254. An example of substrate layer 254 may include but is not limited to nickel-tungsten, stainless steel and Hastelloy. Positioned between stabilizer layer 252 and substrate layer 254 may be buffer layer 256, HTS layer 258 (e.g., an yttrium-barium-copper-oxide—YBCO-layer), and cap layer 260. An example of buffer layer 256 is the combination of yttria, yttria-stabilized zirconia, and cerium oxide ($CeO_2$), and an example of cap layer 260 is silver. A solder layer 262 (e.g., a SnPbAg layer) may be used to bond stabilizer layers 252 and 253 to cap layer 260 and substrate layer 254.

In addition to the above-described wire configuration, other wire configurations are considered to be included within the scope of this disclosure. For example, a single stabilizer layer may be used. Alternatively, a second HTS layer (with its buffer and cap layers, not shown) may be located between second stabilizer layer 253 and the underside of substrate 254. Optionally, the HTS wire may consist of two stabilizer layers positioned on the outside of the HTS wire, with two substrates (each with a buffer layer, an HTS layer, and a cap layer), separated by a third stabilizer layer positioned between the two substrate layers. A solder layer may be used to facilitate any of the required bonds (except possibly between substrate layer 254, buffer layer 256, HTS layer 258 and cap layer 260).

Figure 5B:
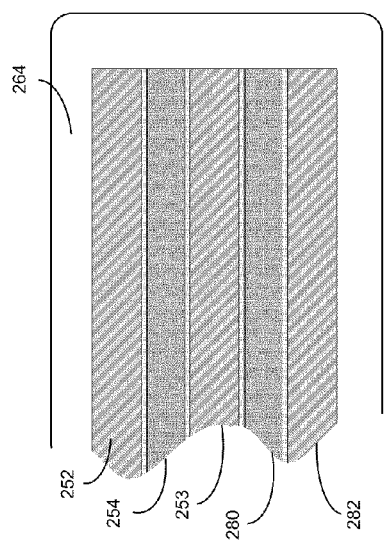
FIG. 5B is a cross-sectional view of an alternative embodiment HTS wire.

Referring also to FIG. 5B, there is shown HTS wire 250', which is an alternative embodiment of HTS wire 250. HTS wire 250' may include a second substrate layer 280 positioned between second stabilizer layer 253 and third stabilizer layer 282. Positioned between stabilizer layer 253 (and/or stabilizer layer 282) and substrate layer 280 may be a buffer layer, an HTS layer (e.g., an yttrium-barium-copper-oxide—YBCO-layer), a cap layer, and a solder layer.

The Stabilizer Layer of HTS Wire

The HTS wire functions most effectively and economically as a fault current limiter if the heat capacity of the HTS wire is high and the electrical resistivity of the HTS wire is at an optimal level. Stabilizer layer 252 may be essential to achieving these properties. Examples of alloys that may be particularly well suited for stabilizer layer 252 are low alloy brasses (e.g., Cu—Zn), with e.g., Zn in the 3-40% wt range, as well as possibly other brass alloys based on e.g., the Cu—Sn alloy system. Alloys with resistivities in the 0.8-15 micro-ohm cm. range in the 77-110 K temperature range may be optimal. Particular brass alloys may include but are not limited to brass 210 (95 Cu-5 Zn), 220 (90 Cu-10 Zn), and 230 (85 Cu-15 Zn), 240 (80 Cu-20 Zn) and 260 (70 Cu-30 Zn). Other copper-based alloys may include e.g., the Monel series (Cu—Ni), which may also provide the above-described range of resistivities. Cu—Ni alloys or others with a magnetic transition in the 70-110 K range may be used and may have the additional advantage of a large specific heat peak in this temperature range. However, care should be taken with these alloys to minimize magnetic AC losses by minimizing coercivity.

In order to provide for adequate flexibility in cabling, stabilizer layer 252, 253 may be in a soft temper state, for example ½ or ¼ hard. The typical total thickness of stabilizer layers 252, 253 of a given HTS wire may be in the 100-600 micrometer range, more preferably in the 200-500 micrometer range. If the wires become too thick and rigid, they may become difficult to strand into the helical winding of a continuously flexible cable. The thermal conductivity of stabilizer layer 252, 253 may be greater than 0.1 W/cmK in the 77-110 K temperature range to mitigate overheating of the HTS layer (e.g., HTS layers 102, 104) during the early stages of a fault and to provide for sufficiently rapid recovery. Stabilizer layer 252, 253 may be applied by e.g., solder lamination or adhesive bonding. Further, stabilizer layer 252, 253 may also be applied by a coating method such as dipping, plating, vapor deposition, electrodeposition, metal-organic liquid-phase deposition or spraying, as either a metal or composite.

Encapsulants for HTS Wire

Additional specific heat may be provided by optionally adding a poorly-conducting "insulator" layer deposited or wrapped around the stabilized HTS wire to encapsulate it. This poorly-conducting insulator layer may be referred to as encapsulant 264. Encapsulant 264 may form a liquid-impermeable layer of generally limited heat transfer coefficient to delay heat introduction into the surrounding liquid coolant (e.g., liquid nitrogen), thus allowing the temperature of the HTS wire to thermalize, i.e., become more uniform across its cross section and thus minimize the occurrence of hot spots and gas bubble formation in the liquid coolant. The surface of the HTS wire may also be optimized (e.g., with surface features and surface chemistry) to inhibit the onset of liquid coolant bubbling or boiling.

Encapsulant 264 may be a polymer (e.g., polyethylene, polyester, polypropylene, epoxy, polymethyl methacrylate, polyimides, polytetrafluoroethylene, and polyurethane) that includes common electrically insulating materials. The thickness of encapsulant 264 may be selected to balance the need to cool the HTS wire by heat transfer into the surrounding liquid coolant and the need to maximize the temperature of the HTS wire without forming gas bubbles within the surrounding liquid coolant. A general thickness range for encapsulant 264 is 25-300 micrometers, and a desirable thickness range for encapsulant 264 is 50-150 micrometers.

In a preferred form, encapsulant 264 may also be weakly electrically conducting, perhaps through the addition of conducting particles such as metal, graphite or carbon powder, or may be selected from some of the partially electrically conducting polymers. The net electrical resistivity of encapsulant 264 may be in the range of 0.0001-100 Ohm cm. While this modest electrical conductivity may not significantly reduce the fault-current-limiting resistance of the HTS wire in its resistive or normal state, this conductivity may insure that the HTS wires in the HTS cable remain at an equipotential at each cross-section and allow for current sharing between the different HTS wires in HTS cable 150. Maintaining an equipotential is important in case of surges of current that may otherwise cause inductively-induced potential differences between the HTS wires, leading to dielectric breakdown and possible damage to the HTS wires. Optionally, encapsulant 264 may be a high resistivity metal or semiconducting material with resistance in this range, or an enamel, glass or crystalline oxide material, which may also contain electrical conductivity enhancing materials.

The outer surface of encapsulant 264 may be coated with a material that decreases the coefficient of heat transfer between encapsulant 264 and the surrounding liquid coolant (e.g., liquid nitrogen). Alternatively, the surface of encapsulant 264 may be textured to enhance the coefficient of heat transfer between encapsulant 264 and the surrounding liquid coolant (e.g., liquid nitrogen). Further, the surface of encapsulant 264 may be coated with e.g., higher conductivity metal particles or protruding metals fibers so as to inhibit nucleation by rapidly dissipating heat outward into the surrounding liquid coolant. However, any such surface treatments must also avoid decreasing the dielectric strength in the liquid state.

Encapsulant 264 may be applied using various wrapping/coating methods, including e.g., multi-pass approaches that statistically reduce the incidence of perforations in comparison to single pass approaches. Alternatively, encapsulant 264 may be applied by a coating method such as dipping, extrusion, plating, vapor deposition or spraying.

Encapsulant 264 may be applied while the HTS wire is in axial tension, up to for example tensile strains in the wire of 0.3% (e.g. of order 100 MegaPascals), thus placing encapsulant 264 in a compressed state upon completion of the application process, and reducing the likelihood of perforations in encapsulant 264. Accordingly, once completed, encapsulant 264 may be axially compressed, while the HTS wire within encapsulant 264 is axially tensioned (when compared to their initial states).

If encapsulant 264 is applied using a wrapping procedure, an additional, impregnating coating (e.g., a polymer, a paint or a varnish, not shown) may be applied that penetrates any gaps/openings in encapsulant 264 into the wrapped layers with an impermeable material, thus forming a hermetically-sealed encapsulant. Alternatively, a wrapped encapsulant may be made hermetic by a rolling or compression process (e.g., isostatic pressing) that seals the above-referenced gaps/openings. Avoiding gaps or openings is important because liquid cryogen penetrating towards the metallic stabilizer layers of the wire may initiate gas bubble nucleation and boiling during a fault.

Another class of encapsulants or stabilizers are materials that undergo an endothermic phase transition, such as melting or crystal structure phase transition. The use of a material that undergoes such an endothermic phase change at some temperature above the operating temperature of the HTS wire (but below the maximum allowable temperature of the HTS wire) is preferred. An example of an endothermic phase change is the melting of e.g., low melting temperature organic or inorganic materials, that may be added: to encapsulant 264 as discrete embedded particles in a composite reinforcement material; as gels/paints that may be applied to the surface/interfaces of encapsulant 264; or selectively to certain regions of encapsulant 264 (e.g., edges, fillets, or in internal conduit regions). Endothermic phase changes may also include e.g., certain intermetallic phase changes, ordering phase changes, or other second order phase transitions. For example, the material selected for encapsulant 264 may melt in the −160° to −70° C. range, with the material boiling above approximately −50° C. (with a preferably boiling point above ambient temperature), so as to make application of encapsulant 264 comparatively easy and economical in the liquid or composite state (i.e., as a paint, a film coating, an emulsion or a gel).

Summary of Wire and Cable Design Criteria

The above-described HTS wire design criteria (i.e., with a thicker stabilizer layer, intermediate values of resistivity, and encapsulants) differ fundamentally from the criteria for prior fault-current-protected HTS cables, which use first generation HTS wire, and a multifilamentary composite with a matrix of high conductivity (<0.5 microOhm-cm in the 77 K temperature range) silver. In such prior fault-current-protected HTS cables, the goal was to use as high a conductivity material as possible in the HTS wire or in the HTS cable structure, including large amounts of copper in the cable. The HTS wire design for use in FCL-cables also differs fundamentally from the design criteria for standalone FCLs or the SUPERPOLI busbars, in which very high resistivity materials were used and any stabilizer layer is kept as thin as possible to insure a high resistance in a short module length. Specifically, for standalone FCLs or the SUPERPOLI busbars, either bulk superconductors are used (which may have a resistivity of 100 microOhm-cm in the 90-110 K temperature range when they are quenched to their normal, resistive state) or coated conductor wires are used, with high resistance substrates like stainless steel. These substrates may have resistivities of over 20 microOhm-cm, and in some cases as high as 70 microOhm-cm, in the 77 K temperature range.

Operation in a Utility Grid

Figure 6:
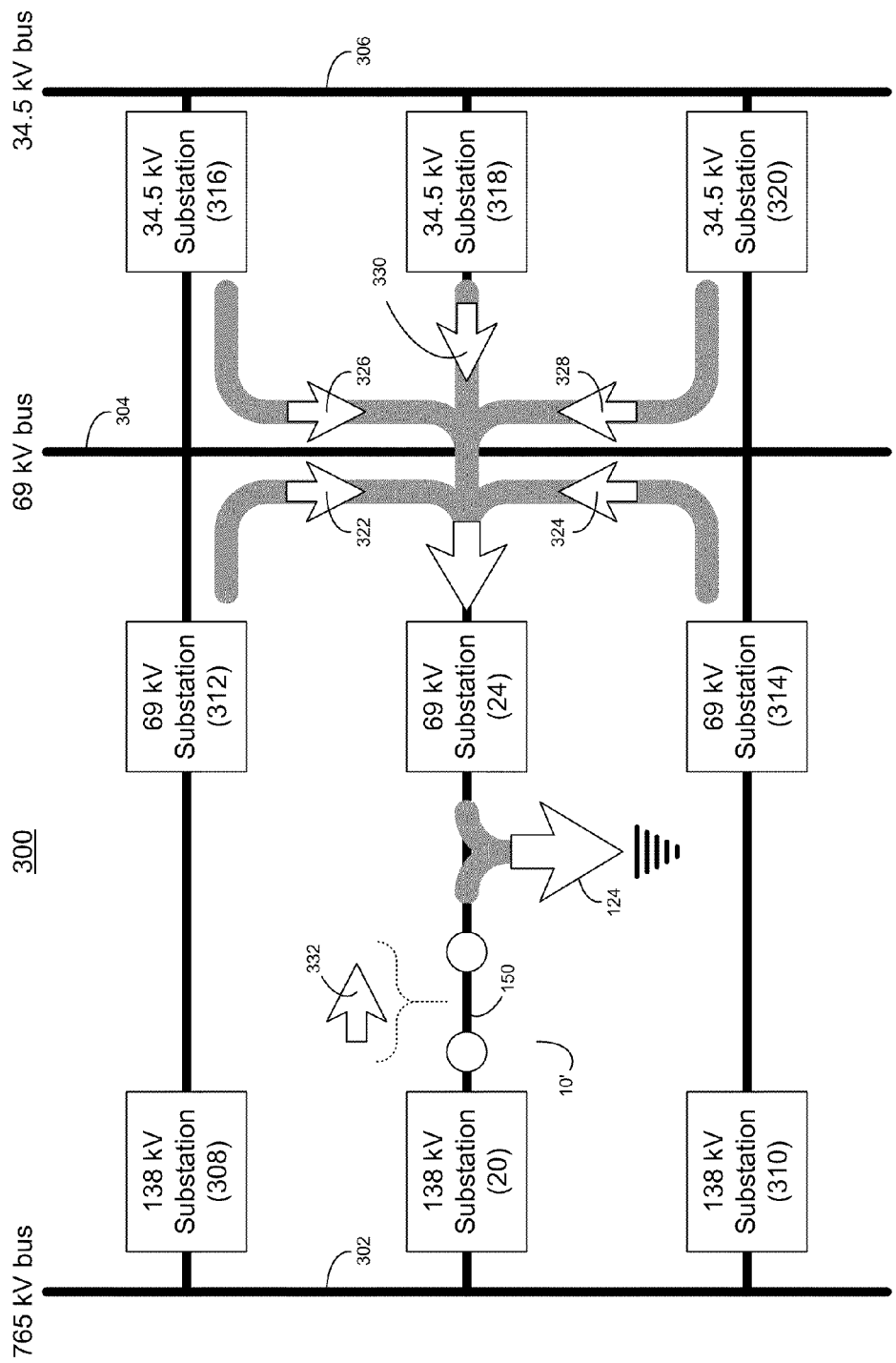
FIG. 6 is a schematic diagram of a utility power grid.

Referring also to FIG. 6, the operation of fault current limiting HTS cable 150 within the context of utility power grid 300 is shown. In this particular example, utility power grid 300 is shown to include 765 kV bus 302, 69 kV bus 304, and 34.5 kV bus 306. Further, utility power grid 300 is shown to include three 138 kV substations 20, 308, 310, each of which provides power to 69 kV bus 304 through three 69 kV substations 24, 312, 314. Three 34.5 kV substations 316, 318, 320 may provide power from 69 kV bus 304 to 34.5 kV bus 306. The fault current limiting HTS cable 150 is shown coupled between substations 20 and 24.

When a fault current (e.g., fault current 124) is present within utility power grid 300, various current components 322, 324, 326, 328, 330, 332 (i.e., the portion of fault current 124 passing through HTS cable 150) may flow from all interconnected substations through all available paths to feed fault current 124, which may appear as a very large load placed on utility power grid 300. When calculating the current components realizable during a fault condition, fault current 124 may be modeled as a short-circuit to ground.

Figure 7:
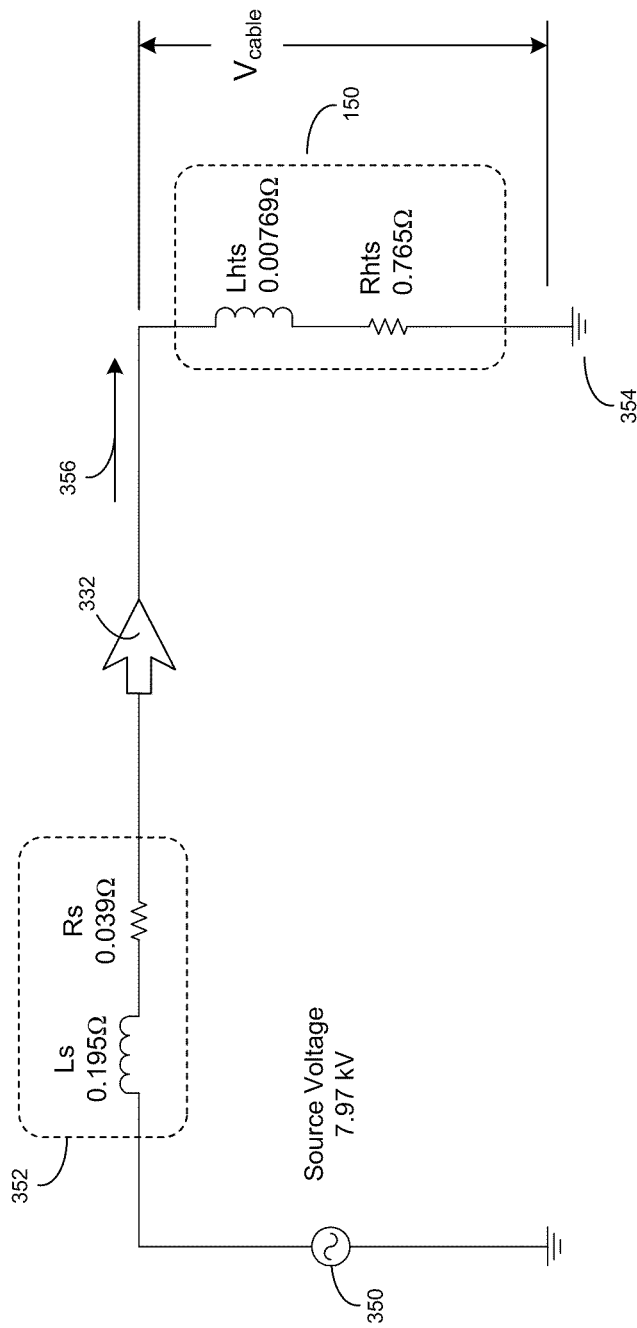
FIG. 7 is a model of the hollow-core HTS cable of FIG. 3 installed within a utility power grid.
Figure 8:
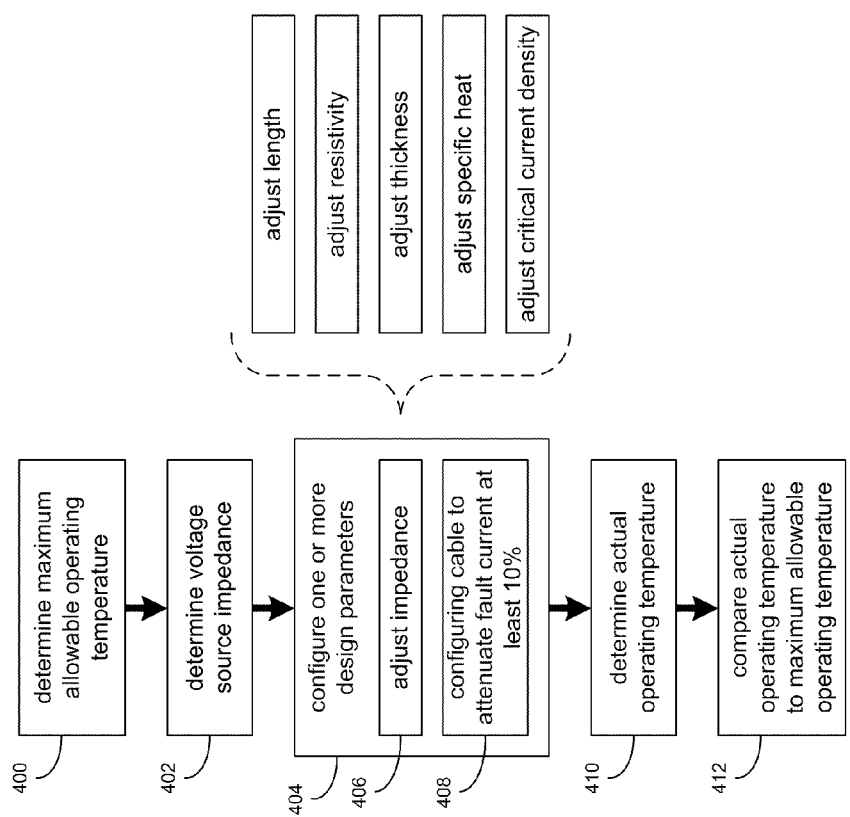
FIG. 8 is a flowchart of a method of configuring the hollow-core HTS cable of FIG. 3.

Referring also to FIGS. 7 & 8, when determining how much fault current a particular substation (e.g., substation 20) contributes to e.g., fault current 124, the open circuit generation voltage may be modeled as ideal voltage source 350. Further, the upstream impedance (i.e., the impedance seen looking upstream from HTS cable 150) may be combined with the transformer impedances (i.e., of substation 20) and represented as source impedance 352. Impedance in this context may be a complex vector quantity consisting of a real and a reactive component. Mathematically, impedance (Z) is equal to R+jX, where R is the real (i.e., resistive) component and X is the reactive (i.e., inductive/capacitive) component. In this example, the reactive component is an inductive impedance and equal to $j\omega L$, where $\omega=2\pi f$ and f is the frequency of the current flow (e.g., 60 Hz in North America).

HTS cable 150 is shown terminated to ground 354 because, as discussed above, fault current 124 is modeled as a short circuit to ground. Ohm's Law may be used to determine the expected level of fault current (i.e., current component 332) provided by substation 20. Using this approach with respect to the other substations within grid 300, the overall fault current contributions (i.e., the value of e.g., current components 322, 324, 326, 328, 330) may be calculated and the fault current component expected to pass through HTS cable 150 (i.e., current component 332) may be determined. Unfortunately, current component 332 may be above the level that circuit breakers 34, 36 are capable of handling. Accordingly, HTS cable 150 may be designed to limit this otherwise expected fault current component 332 to a lower, predetermined level that circuit breakers 34, 36 are capable of handling.

Another important application of the fault current limiting HTS cable is in applications establishing bus-ties within or, more importantly, interconnections between bus-ties in different substations, as shown by the lines 304 and 306 in FIG. 6. These interconnections allow sharing of power between different substations or different transformers within substations depending on the grid loading requirements, while at the same time maintaining control of fault currents that would otherwise grow in making such interconnections.

Design of Fault Current Limiting HTS Cable

When designing fault current limiting HTS cable 150, one or more design characteristics of HTS cable 150 may be configured so that any temperature rise ($\Delta$ T) that occurs within HTS cable 150 during a fault current is at a level that is below a maximum temperature rise (i.e., $\Delta$ $T_{max}$), as exceeding $\Delta$ $T_{max}$ may result in the formation of gaseous nitrogen bubbles. As discussed above, the creation of gaseous nitrogen bubbles may reduce the dielectric strength of the dielectric layer and may result in voltage breakdown and the damage of HTS cable 150. At the same time, HTS cable 150 may be designed to be adequately long (i.e., above a minimum length) to provide adequate resistance to limit the fault current when the HTS wire within HTS cable 150 is driven into its normal (i.e., resistive) state.

Accordingly, when designing HTS cable 150, a determination 400 may be made concerning the maximum allowable operating temperature for e.g., HTS cable 150. For a liquid nitrogen cooled HTS cable with a pressure of 15 bar, the maximum allowable operating temperature is close to 110° K (i.e., the boiling point of liquid nitrogen @ 15 bar). Accordingly, for liquid nitrogen that is subcooled to 72° K, $\Delta$ $T_{max}$ is 38° K, or, to provide some design margin, $\Delta$ $T_{max}$ is chosen to be 30° K. These are typical values for practical HTS cables, but pressures and temperature rises may vary depending on specific designs.

As discussed above, all cables (both conventional and HTS) attenuate fault current to some degree because all cables have real and reactive impedances. However, a typical fault-current-protected HTS cable with large amounts of copper has a very low resistive impedance even when the HTS wire is quenched into its normal state. Therefore the reduction of maximum fault current due to the resistance of the quenched HTS wire is very small, perhaps 1% or less, and much less than a minimum level of 10% to provide a significant improvement in the operation of a utility grid. Additionally and as discussed above, the real and (to a lesser extent) the reactive impedance components in HTS cables (e.g., HTS cable 150) may increase several orders of magnitude when the current passing through HTS cable 150 exceeds a critical current level (as defined above). Accordingly, if properly designed to exclude copper and optimize the resistance of the wire with its stabilizer, HTS cable 150 may function as a fault current limiting device and may attenuate a fault current to a level below several times the superconducting critical current, thus providing a greater than 10% reduction in the maximum fault current level. In particular, HTS cable 150 may be designed to limit the fault current to a value of the f-factor (defined above) times the critical current.

All significant prior art HTS cable demonstrations to date have included a significant amount of copper at the cryogenic temperature of the superconductor and in close proximity to the superconductor. Therefore, in the event of a fault current that exceeds the critical current level, the majority of the fault current is conducted in the copper, the heat capacity of the prior art HTS cable is increased, and the temperature rise within the prior art HTS cable is limited. While this protects the prior art HTS cable from damage, this structure reduces the amplitude of the fault current very little due to the large amount of high conductivity, low resistance copper.

With respect to HTS cable 150, the high conductivity copper (and/or other high conductivity metals) are removed and an HTS wire (as described above) is utilized that has a comparatively thick (e.g., total thickness of 100-600 micrometers, or preferably 200-500 micrometers) stabilizer having a comparatively high resistivity (0.8-15 microOhm-cm, or preferably 1-10 microOhm-cm). The length of HTS cable 150 should be long enough (e.g., typically greater than 200 m) so that the total resistance of the quenched stabilized HTS cable 150 is large enough to reduce the maximum fault current to approximately a factor f times the critical current.

Fundamental to the ability to achieve this desired result while, at the same time, providing flexible and high capacity HTS cable 150 is the use of a coated HTS conductor wire 250 (as described above and as illustrated in FIG. 5). HTS layer 258 should be comparatively thin, and should include a comparatively thick stabilizer layer 252, 253 (i.e., typically thicker than HTS layer 258 and substrate layer 254). HTS layer 258 should have a high current carrying capacity (e.g., greater than 1 Megamp per square centimeter at 77 K). A typical critical current per unit wire width $I_{c,w}$ at the operating temperature is 350 A/cm-width, but values for different wires from different laboratories or commercial manufacturers can range from 100 A/cm-width to 1000 A/cm-width. Then, when HTS wire 250 switches to a resistive state, the resistance of HTS wire 250 should be comparatively high, resulting in almost all of the current transferring to stabilizer layer 252, 253. HTS wire 150 should be flexible enough to enable helical winding within HTS cable 150. In practice, the flexibility requirement may limit the total thickness of the combined stabilizer layers 252, 253 to approximately 600 micrometers.

For illustrative purposes, let us assume substation 20 is a three-phase 13.8 kV substation. Accordingly, the line-to-ground voltage provided by substation 20 is 7.97 kV. Further, assume that the unlimited value of fault current component 332 is 40 kA and assume an X/R source impedance ratio of 5 (i.e., a typical value). Accordingly, the real ($R_s$) and reactive ($X_s$) impedance values of source impedance 352 may be determined 402 to be 0.039+j0.195Ω, as follows: 40 kA=7.97 kV/$(R_s^2+X_s^2)^{1/2}$ and $X_s/R_s$=5. For this and subsequent calculations, the three-phase system of a given line-to-line voltage ($V_{LL}$) is modeled as an equivalent single-phase model using the line-to-ground voltage ($V_{LG}$) where $V_{LL}=V_{LG}*(3)^{1/2}$.

For this example, further assume that HTS cable 150 is 1,200 meters in length ($L_{cable}$) and is rated at 3,000 amps rms or 3000 $A_{rms}$ (i.e., $I_{rated}$ in root-mean-square Amperes). As discussed above, inner coolant passage 152 of HTS cable 150 may be surrounded in radial succession by first HTS layer 102 and second HTS layer 104. As the wires of first HTS layer 102 and second HTS layer 104 are helically wrapped around inner coolant passage 152, the actual length of the individual HTS wires (e.g., HTS wire 250) included within HTS layers 102, 104 are longer than the length of HTS cable 150. For this example, assume a spiral factor of 1.08, wherein the actual length of the HTS wires are 8.00% longer than the length of HTS cable 150.

Additionally, assume that for this example, HTS cable 150 is designed to go normal at 1.6 times $I_{rated}$. This factor may be called a trip-current factor $f_{tc}$. Accordingly, HTS cable 150 may be designed to exhibit superconducting characteristics until 4,800 $A_{rms}$. The critical current of the cable is then 4800×1.414=6787 A at its operating temperature.

Numerous design parameters may be configured 404 when constructing HTS cable 150, examples of which may include but are not limited to: HTS wire width (W); critical current per unit width ($I_{c,w}$); trip current factor $f_{tc}$ f-factor (see below); stabilizer or composite resistivity (ρ); stabilizer or composite thickness (t); conductor specific heat (c); fault current duration (τ); wire count in each phase (N); and cable inductance (X). The total HTS cable critical current may be $I_{c,w}$ WN. By configuring 404 these design parameters, the impedance of HTS cable 150 may be adjusted 406 and/or HTS cable 150 may be configured to attenuate a fault current through the HTS cable down to the total cable critical current times the f-factor, which for typical grid conditions is much larger than 10% of the original maximum fault current.

HTS Wire Width (W): This design parameter refers to the width of the individual HTS wires (e.g., HTS wire 250) utilized within HTS layers 102, 104. For this example, assume an HTS Wire Width (W) of 0.44 cm, as commercially available from American Superconductor (344 superconductors). This width is primarily determined by the mechanical requirements of helically winding the HTS wires around the flexible former of a power cable.

Critical Current per Unit Width ($I_{c,w}$): This design parameter refers to the maximum current level realizable by the individual HTS wires per width of the tape-shaped conductor at the standard electric field criterion discussed above. For this example, assume a Critical Current per Unit Width ($I_{c,w}$) of 350 Amperes per cm-width (i.e. A/cm-width) at the operating temperature. This parameter is largely determined by the required rating of the cable and the need to minimize the number (N) of HTS wires used to fabricate the HTS cable.

Trip-Current Factor $f_{tc}$. As discussed above, a typical utility design requirement is $f_{tc}=1.6$.

f-Factor (f). This design parameter, first proposed by Kraemer et al. (See *Switching Behavior of YBCO Thin Film Conductors in Resistive Fault Current Limiters* by H. -P. Kraemer et al., IEEE Trans. on Applied Superconductivity, vol. 13, No. 2, June 2003, pp. 2044-7) refers to the ratio between the current when HTS layers 102, 104 go fully normal or resistive and the critical current. As discussed above and in this example, HTS cable 150 goes normal at 4,800 $A_{rms}$ (or about 6,790 A peak). By multiplying this peak value (i.e., 6,790 A) by the f-factor, the value at which HTS cable 150 is fully normal (i.e., non-superconducting) may be determined. A first determination done for YBCO thin films by Siemens ((See *Switching Behavior of YBCO Thin Film Conductors in Resistive Fault Current Limiters* by H. -P. Kraemer et al., IEEE Trans. on Applied Superconductivity, vol. 13, No. 2, June 2003, pp. 2044-7) yielded an f-factor value of approximately 2. This f-factor is expected to be in the same range for YBCO coated conductor wires (e.g., a range from 1 to 4). For this and subsequent examples, we assume an f-factor of 2, following the Siemens result. Accordingly and for the above-described example, we estimate that HTS cable 150 will be fully normal (i.e., non-superconducting) at about 6,790 Amperes times 2 (i.e., the f-factor) or 13,580 Amperes. Thus, with a properly configured 408 cable (see below), a fault current of 40,000 $A_{rms}$ (56,600 $A_{peak}$) may be limited to 13,580 $A_{peak}$. This represents a reduction of fault current by 76%, significantly larger than the minimum level of 10% needed for useful operational improvement of an electric power grid.

Resistivity ($\rho$): This design parameter (which may also be known as specific electrical resistance) is a measure of how strongly a material opposes the flow of electric current. Typically, resistivity ($\rho$) is a function of temperature and may be expressed as $\rho_{xx}$, where "xx" defines the temperature for which the resistivity is calculated. For this example, assume a resistivity ($\rho_{90}$) of 4.0 microOhm-cm at temperature of 90° K, and for simplicity we assume in the estimates below that the temperature dependence in the range from 70 to 110 K may be ignored. Such a resistivity may be found in e.g., brass. The concentration of zinc may be varied to control the resistivity, with higher resistivities in alloys with more zinc. Many other alloys may show similar variations of resistivity with alloy composition; so there are multiple choices for the stabilizer material.

Stabilizer Thickness (t): This design parameter refers to the thickness of stabilizer layer 252 included within HTS wire 250. For this example, assume that total stabilizer thickness (t) is approximately 350 micrometers. To be more precise, the HTS wire, comprising a substrate layer, superconductor layer, a cap layer, a solder layer, a stabilizer layer, and an encapsulant, may be a multilayer composite and may be characterized by the net composite resistivity and thickness of the HTS wire. Since the stabilizer layer is the dominant portion of the wire, the resistivity of the multi-layer composite may be close to the resistivity of the stabilizer layer. However, for simplicity in the estimates below, we assume that in its quenched state current flows primarily in the stabilizer layer. Further refinements of this type may be evident to those skilled in the art.

Specific Heat per volume (C): This design parameter refers to the specific heat per volume of the composite HTS wire, including substrate layer, HTS layer, cap layer, solder layer and stabilizer layer. For the typical materials used in the HTS wire, C is close to 2 Joules/cm$^3$K for a temperature of approximately 77 K. For simplicity, we assume this value throughout the temperature range 70-110 K, even though C may vary by 10-20% in this range for certain materials. If HTS wire includes a poorly conducting encapsulant, the encapsulant may add to the specific heat of the wire after several seconds when heat diffusion can thermalize the wire, bringing it to a constant temperature. As a simple approximation for the temperature rise calculation below, we can approximate the effect of the encapsulant by assuming that the composite's specific heat is increased by a factor $1+(C_i t_i/Ct)$, where the subscript i refers to the encapsulant. In most cases, the encapsulant heat capacity in the 77 K temperature range is also about 2 Joules/cm$^3$K, and so for an encapsulant as thick as the composite wire, this factor is 2.

Fault Current Duration ($\tau$): This design parameter refers to the time before fast switch assembly 202 or circuit breakers 34, 36 disconnect HTS cable 150 from grid portion 10'. It is desirable to make this time as short as possible to minimize the energy deposited as heat in the cable, and thus to minimize the heat rise. The fastest switches readily available commercially, along with their sensing circuitry, open in four cycles (i.e., 67 msec). Thus, the fault current duration is considered to be 67 msec. If even faster switches become available in the future, it will be desirable to use them.

Wire Count (N): This parameter refers to the total number of wires included within the phase conductor of each phase of the HTS cable. Typically, these are arranged in two HTS layers (e.g., HTS layers 102, 104) and are helically wound with the two layers having opposite winding sense (i.e., helicity). For a 3,000 $A_{rms}$ rated cable with 350 A/cm-width critical current per width at the operating temperature, a let-through current factor of 1.6, and a wire width of 0.44 cm; the required conductor count N is 44.

Reactance (X): This design parameter refers to the inductance per unit length, determined by the amount of magnetic flux produced for a given electric current per unit length. For this example, assume an Inductance (X) of 0.017 mH/km, which is characteristic of the Triax cable described below in its supereconducting state.

As substation 20 (in this example) is a three-phase 13.8 kV substation, HTS cable 150 may be a Triax cable (e.g., the Triax HTS Cable arrangement proposed by Ultera, which is a joint venture of Southwire Company of Carrollton, Ga. and nkt cables of Cologne, Germany). Each of the phases consists of two layers of helical windings, and are all configured coaxially and separated by dielectric. The copper strands in the present Triax cables from Ultera will need to be removed and the wires described above will need to be used to modify the Triax cable into an FCL-cable.

The resistive component of impedance (Z) of HTS cable 150 in its quenched state $R_{hts(quenched)}$, shown in FIG. 7, may be calculated as follows with the parameters given above:

$$R_{hts(quenched)} = \frac{(\rho_{90})(L)}{(t)(W)(N)}$$

$$R_{hts(quenched)} = \frac{(4.0\ \mu\Omega\ cm)(1.08 \times 120{,}000\ cm)}{((0.0350\ cm)(0.44\ cm)(44)}$$

$$R_{hts(quenched)} = 0.765\ \Omega$$

The inductive impedance of the cable is negligible compared to this relatively large resistive impedance. Given a specification sheet value of 0.017 mH/km for a typical cable, one can calculate the equivalent inductance $L_{hts}$ as 0.017 mH/km*1.2 km=0.0204 mH. Reactive impedance $X=j\omega L$, where $w=2\pi f$ and f is the frequency of the current flow (e.g., 60 Hz in North America) which results in $X_{hts}=0.00769\Omega$, which is 100 times smaller than $R_{hts(quenched)}$.

Using Ohm's law and the equivalent circuit illustrated in FIG. 7 with the source impedance 0.039+j0.195Ω as given above, the voltage drop ($V_{cable}$) across one phase of HTS cable 150 may be calculated using standard Kirchhoff's laws to be 7,348 $V_{rms}$. The corresponding rms current ($I_{cable}$) 356 passing through HTS cable 150 is $V_{rms}/R_{hts(quenched)}$=9,604 $A_{rms}$, which corresponds to a peak current of 9604×1.414 or 13,580 A. Accordingly, current component 332 was reduced from 40,000 $A_{rms}$ to 9,604 $A_{rms}$ (i.e., a reduction of 76.0%).

As discussed above, the temperature rise (ΔT) that occurs within HTS cable 150 during a fault current should be kept at a level that is below a maximum temperature rise (i.e., $\Delta T_{max}$), as exceeding $\Delta T_{max}$ may result in the formation of gaseous nitrogen bubbles.

When determining 410 the actual operating temperature of HTS cable 150, the temperature rise (ΔT) realized by HTS cable 150 may be determined from a simple adiabatic calculation, equating the heat generated $\rho_{90}\ J^2\ \tau$ (where the rms current density J in the quenched superconductor wire is $I_{cable}/WNt = fI_{c,w}/\sqrt{2}t$) to the heat absorbed C ΔT. From this relationship, ΔT can be calculated as follows, using the parameters given above:

$$\Delta T = \frac{(\rho_{90})(I_{cable}^2)(\tau))}{((W)(N)(t)^2)(C)}$$

$$\Delta T = \frac{(0.000004\ \Omega\ cm)(9604\ A)^2(0.067\ sec)}{((0.44\ cm)(44)(0.035\ cm))^2(2\ Joules/cm^3 K)}$$

$$\Delta T = 26.9°\ K$$

Accordingly, as the temperature rise (ΔT) realized by HTS cable 150 is less than the maximum allowable temperature rise ($\Delta T_{max}$), gaseous nitrogen bubbles will not be formed, the dielectric strength of the dielectric layer will not be reduced, and HTS cable 150 will not be at risk of dielectric breakdown leading to permanent damage to the cable. Specifically, for an HTS cable with a pressure of 15 bar, the boiling point of liquid nitrogen is 110° K. Accordingly, for a cable operating with liquid nitrogen that is subcooled to 72° K, a temperature rise (Δ T) of 26.9° K results in an actual operating temperature of 98.9° K, which is a safe operating temperature when compared 412 to the 110° K boiling point of liquid nitrogen.

Upon examining the above equation, it becomes clear that increasing the values in the denominator reduces temperature rise (ΔT), while increasing the values in the numerator increases temperature rise (ΔT). Accordingly, an increase in fault current duration (τ) and/or resistivity ($\rho_{90}$) may result in an increase in temperature rise (ΔT). Conversely, an increase in stabilizer thickness (t) or specific heat (C) may result in a decrease in temperature rise (Δ T). The wire width W and the number of wires N are already determined by the practical requirements of stranding the cable and the cable rating coupled with the critical current per width of the wire.

At the same time, the length of the HTS wire in the cable must be long enough to achieve the required resistance. Since a) the maximum limiting current is the f-factor times the wire critical current per width $I_{c,w}$ times the total width of all wires WN, and b) the resistance is ρL/WNt; the minimum length of wire in HTS cable 150 is:

$$L_{min} = (V_{peak})(t)/(f)(I_{c,w})(\rho) \quad \text{[Equation 1]}$$

With the above values, $$L_{min} = (1.414 \times 7348\ V)(0.035\ cm)/(2)(350\ A/cm)$$
$$(0.000004\ \Omega cm).$$

$$L_{min} = 1{,}300\ m$$

Taking into account the 1.08 spiral factor, this length corresponds to the 1200 m cable length originally assumed. Note that for longer lengths, the maximum temperature rise (ΔT) anywhere in the cable will remain at the level calculated above as long as the current is limited to $fI_{c,w}$WN. In this case, only portions of the HTS wire will quench, in the manner shown by Siemens (See *Switching Behavior of YBCO Thin Film Conductors in Resistive Fault Current Limiters* by H. -P. Kraemer et al., IEEE Trans. on Applied Superconductivity, vol. 13, No. 2, June 2003, pp. 2044-7), and the limited current remains at the level $fI_{c,w}$WN. However, for shorter lengths, the resistance of the HTS wires in the quenched state will decrease, and the current will increase for a given voltage according to $I=V/R_{hts,quenched}$. This may lead to greater heating and increased temperature rise according to the equation for ΔT given above. Therefore, the cable length must be greater than that calculated above (i.e., 1,300 meters).

Note that the temperature rise may also be calculated as follows:

$$\Delta T = \rho(fI_{c,w}/t)^2 \tau / 2C \quad \text{[Equation 2]}.$$

From these last two equations, referred to as Equations 1 & 2, one can see that if one wants to decrease the minimum wire and cable length by increasing the resistivity ρ or the critical current density $I_{c,w}$ or decreasing the stabilizer thickness t, temperature rise ΔT will increase. Alternatively, an increase in the heat capacity through the use of an encapsulant may decrease the temperature rise. For example, doubling the heat capacity may allow the same temperature rise with twice the resistivity, and this may reduce the minimum cable length by a factor of two. Note that these equations do not depend on the wire width W or number of wires N except insofar as they are determined by the operating rating of the cable and the critical current per width $I_{c,w}$ or the HTS wire.

The conclusion of this cable design analysis is that for applications in which all the fault current flows through HTS cable 150, the minimum length for an FCL HTS cable is in the range of a kilometer for 13.8 kV class distribution systems. This can be reduced further through e.g., the use of higher heat capacity as described above. Minimum lengths for other voltages and parameters may be calculated by those skilled in the art from the equations given above or from a more complete analysis taking into account the temperature dependences of all the parameters.

However, if a parallel impedance is provided directly across cable 150 (e.g. from breaker 34 to breaker 36 in FIG.

4), the voltage on cable 150 may be reduced significantly. For example, we consider a source impedance to be 0.2Ω (inductive) in a 13.8 kV system, corresponding to a single phase fault current of 40 $kA_{rms}$ in a 13.8 $kV_{rms}$ grid with a single phase voltage of 8 $kV_{rms}$. A conventional inductive impedance of 0.046Ω in parallel with HTS cable 150 may reduce the voltage on cable 150 to 1500 $V_{rms}$ and give a fault current of 32.5 kA. With this reduced voltage and the parameters above (including a factor of two increase in the heat capacity using encapsulant 264, FIG. 5), the critical length formula leads to a minimum cable length of about 100 m. Thus, FCL cables may be designed for 13.8 kV grids with lengths as short as 100 m, provided parallel impedances can be used.

For longer length cables, the resistivity may be decreased, and the temperature rise correspondingly decreased. This may have the advantage of reducing the recovery time for the cable to return to its original operating temperature. For example, for a cable 4.8 km long, the resistivity in the above example may be reduced to 1 microOhm-cm, and the temperature rise may be reduced from 26.9 K (without encapsulant 264, FIG. 5) to 6.7 K.

In the future, faster switch assemblies may become available. In this case, the fault duration τ may be decreased and a larger resistivity may be permitted. For example, with a fault duration of 27 msec, the resistivity may be increased to 10 microOhm-cm, and the minimum length of the cable may be decreased (without encapsulant) by a factor of 2.5 (10 microOhm-cm divided by 4 microOhm-cm).

Therefore, the concept of an FCL-cable disclosed here may be practiced with resistivities ranging from 1 to 10 microOhm-cm, and with some further adjustment in the parameters considered above, this range could be extended to 0.8 to 15 microOhm-cm. However, the low 77 K resistivity of copper (0.2 microOhm-cm) or the high resistivity of stainless steel (50 microOhm-cm) are out of range for a practical continuously flexible long-length FCL cable.

Corresponding variations are possible in the parameters of stabilizer thickness t and $I_{c,w}$, though in both cases these may be constrained by cabling requirements (i.e., the stabilizer cannot get too thick to avoid making the HTS wire too stiff to cable) and by the need to meet utility current ratings.

For transmission level voltages such as 138 kV, a minimum length may be estimated including an encapsulant increasing the heat capacity by a factor of 2 and an increase in the resistivity from 4 to 8 microOhm cm. According to the length formula (described above), the ten-fold increase in the voltage as compared to 13.8 kV class distribution systems, coupled with the two-fold increase in resistivity, implies a minimum length of (10/2)×1.2 km or 6 km. For transmission level cables, such lengths are common, showing that the FCL cable design is also possible in this case.

Another embodiment of this disclosure is an HTS cable that includes more than one type of HTS wire, for example wire based on the HTS material BSCCO (bismuth-strontium-calcium-copper-oxide) and wire based on HTS material YBCO (rare earth or yttrium-barium-copper-oxide). Different superconducting materials may have different transition characteristics from superconducting to normal state. For example, YBCO has a much sharper transition than BSCCO, making it more effective in an FCL application, even though both materials have been used in the past (e.g., in the SUPERPOLI program) to demonstrate FCL characteristics. In this embodiment, an HTS cable made from BSCCO wire may be designed and operated to act as a fault current limiting cable by adding an adequately long section of a superconducting cable made from YBCO coated conductor wire. This may be achieved by splicing in the YBCO section of cable designed for FCL operation. At normal operating conditions, both sections are superconducting.

A number of implementations have been described. Nevertheless, it will be understood that various modifications may be made. Accordingly, other implementations are within the scope of the following claims.

What is claimed is:

1. A method of configuring a cryogenically-cooled HTS cable comprising:
    determining a maximum allowable operating temperature for the cryogenically-cooled HTS cable, the cryogenically-cooled HTS cable including a flexible winding support structure configured to support one or more conductive layers of superconducting material positioned coaxially with respect to the flexible winding support structure;
    determining a voltage source impedance;
    configuring one or more design parameters of the cryogenically-cooled HTS cable so that, during the occurrence of a maximum fault condition, an actual operating temperature of the cryogenically-cooled HTS superconducting cable is maintained at a level that is less than the maximum allowable operating temperature, and the maximum fault current is reduced by at least 10%; and
    adjusting an impedance of the cryogenically-cooled HTS cable.

2. The method of claim 1 wherein the maximum allowable operating temperature essentially corresponds to the temperature at which a refrigerant circulating within at least a portion of the cryogenically-cooled HTS cable changes from a liquid state to a gaseous state.

3. The method of claim 2 wherein the refrigerant is pressurized liquid nitrogen.

4. The method of claim 1 wherein the one or more design parameters includes one or more of:
    a wire resistivity factor;
    a stabilizer thickness factor;
    a specific heat factor;
    a fault current duration factor; and
    a wire operating critical current per unit width factor.

5. The method of claim 1 further comprising:
    determining the actual operating temperature of the cryogenically-cooled HTS cable.

6. The method of claim 5 further comprising:
    comparing the actual operating temperature of the cryogenically-cooled HTS cable to the maximum allowable operating temperature for the cryogenically-cooled HTS cable.

7. The method of claim 1 wherein adjusting the impedance of the cryogenically-cooled HTS superconducting cable includes one or more of:
    adjusting a length of the cryogenically-cooled HTS cable above a minimum value;
    adjusting a resistivity of the cryogenically-cooled HTS cable;
    adjusting a thickness of a stabilizer layer bonded to an HTS wire within the cryogenically-cooled HTS cable;
    adjusting a specific heat of an HTS wire by means of an encapsulant in the cryogenically-cooled HTS cable; and
    adjusting an operating critical current density of an HTS wire included within the cryogenically-cooled HTS cable.

8. The method of claim 7 wherein the stabilizer layer is constructed, at least in part, of a brass material.

9. The method of claim 1 wherein the cryogenically-cooled HTS superconducting cable includes one or more HTS wires and wherein at least one of the HTS wires is constructed of a material chosen from the group consisting of: yttrium or rare-earth-barium-copper-oxide; thallium-barium-calcium-copper-oxide; bismuth-strontium-calcium-copper-oxide; mercury-barium-calcium-copper-oxide; and magnesium diboride.

* * * * *